United States Patent [19]

Le Traon et al.

[11] Patent Number: 4,791,351

[45] Date of Patent: Dec. 13, 1988

[54] METHOD AND APPARATUS FOR RAPIDLY TESTING PASSIVE COMPONENTS BY REFLECTOMETRY IN THE VHF RANGE

[75] Inventors: André Le Traon, Cesson Sevigne, France; Haraoubia Brahim, Alger, Algeria; Jean-Claude Pilet; Michel De Burgat, both of Rennes, France; Jean-Loïc Meury; Le Traon Flore, both of Cesson, France

[73] Assignee: Universite de Rennes I, Rennes, France

[21] Appl. No.: 880,177

[22] Filed: Jun. 30, 1986

[30] Foreign Application Priority Data

Jul. 1, 1985 [FR] France ................................ 85 10007

[51] Int. Cl.$^4$ ............................................ G01N 22/00
[52] U.S. Cl. .................... 324/58 B; 324/534; 324/537; 324/548; 324/549; 333/117
[58] Field of Search ................ 324/58 B, 58.5 B, 548, 324/549, 58 R, 58.5 R, 533, 534, 535, 532, 537; 330/53, 56; 333/117; 455/115, 123; 331/177 V, 178, 179, 181

[56] References Cited

U.S. PATENT DOCUMENTS

| | | | |
|---|---|---|---|
| 3,479,587 | 11/1969 | MacKenzie et al. | 324/58 B |
| 4,041,395 | 8/1977 | Hill | 455/115 |
| 4,112,382 | 9/1978 | Morrow et al. | 331/178 X |
| 4,288,875 | 9/1981 | Carter | 331/177 V X |
| 4,506,209 | 3/1985 | Landt | 324/58 B X |
| 4,683,417 | 7/1987 | DeBurgat et al. | 324/60 CD X |

FOREIGN PATENT DOCUMENTS

| | | | |
|---|---|---|---|
| 3410730 | 9/1985 | Fed. Rep. of Germany | 324/58 B |
| 2514902 | 4/1983 | France. | |

OTHER PUBLICATIONS

Fantom, The Location of Reflections in Two-Port Microwave Components, Nov. 1979.
Staeger et al, "Measurement Accuracy Hinge on Coupler Design", Microwaves, vol. 16, No. 4, Apr. 1977, pp. 41-46.
De Ronde, "A Precise and Sensitive X-Band Reflecto Meter Providing Automatic Full-Band Display of Reflected Coefficient", IEEE Transactions, vol. 13, Jul. 1965, pp. 435-440.
Hewlett-Packard Journal, vol. 31, No. 1, Jan. 1980, pp. 22-32, Palo Alto, California "Vector Impedance Analysis to 1000 MHz" T. Ichino et al., FR-A-2 514,902 (Les Cables de Lyon) pp. 2, 4, 5, Figs. 1, 3.
Electronics, vol. 32, No. 43, Oct. 23, 1959, pp. 120-121, New York, U.S. J. Hanson "Unconventional Technique for Measuring VSWR".
Microwave Journal, vol. 10, No. 1, Jan. 1967, pp. 79-83, US "Complex Impedance and Gain Measurement at RF and Microwave Frequencies".
Telecommunications & Radio Engineering, vol. 35/36, No. 4, Apr. 1971, pp. 103-105, Silver Spring, MD, L. I. Babak.

Primary Examiner—Reinhard J. Eisenzopf
Assistant Examiner—Robert W. Mueller
Attorney, Agent, or Firm—Stevens, Davis, Miller & Mosher

[57] ABSTRACT

An apparatus for testing passive two terminal devices in the VHF range comprises an electrical signal generator whose frequency is variable over the VHF range, a distributed constant line having a first end connected to the generator and a second end connected to the device to be tested. A resistive $\pi$ network is connected to the first end of the line to measure directly the values of the incident wave and of the reflected wave or the maxima and the minima of the total wave at the first end of the line are detected, so as to determine the coefficient of reflection of the line connected to the device to be tested.

43 Claims, 17 Drawing Sheets

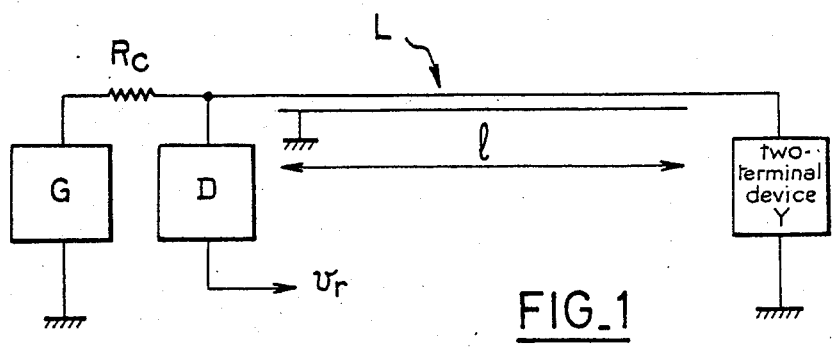
FIG_1
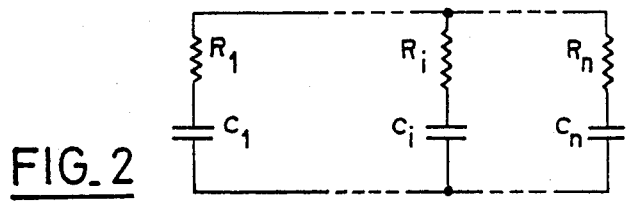
FIG_2
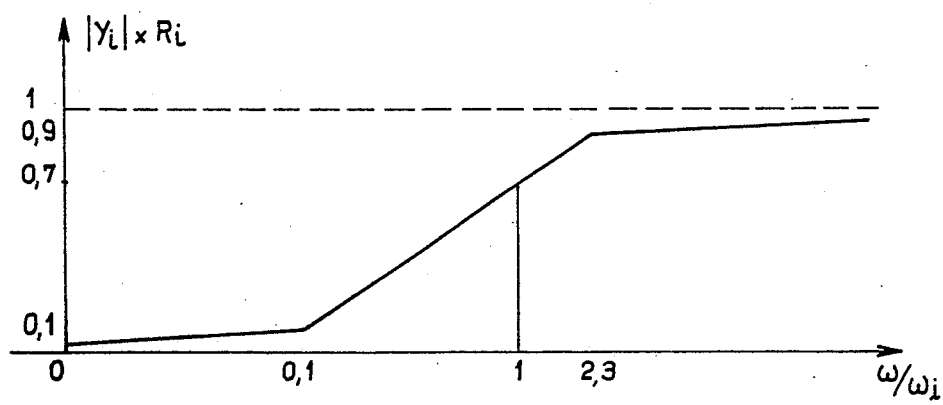
FIG_3
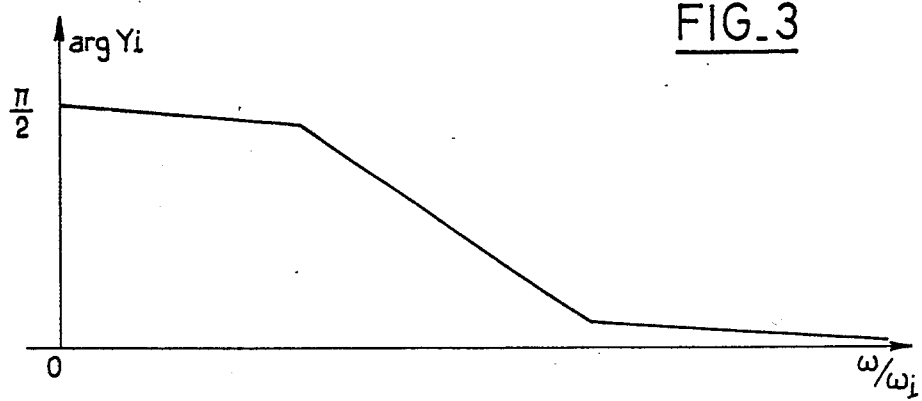
FIG_4

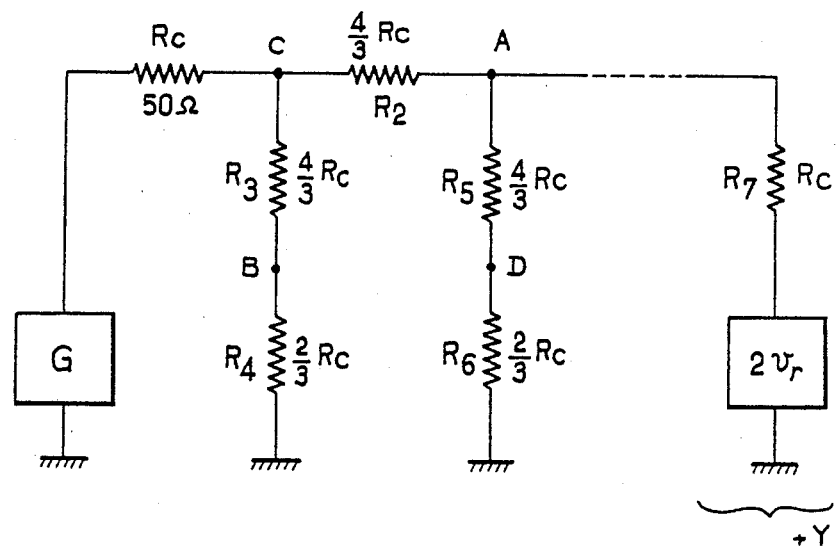
FIG_5
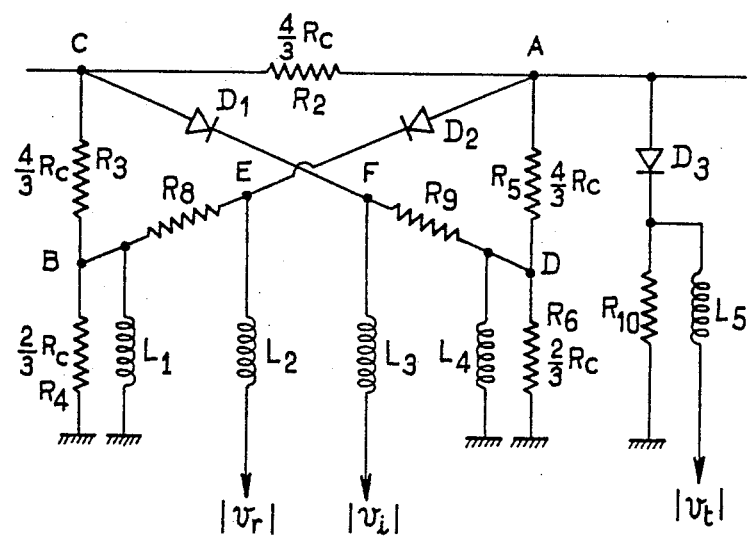
FIG_6

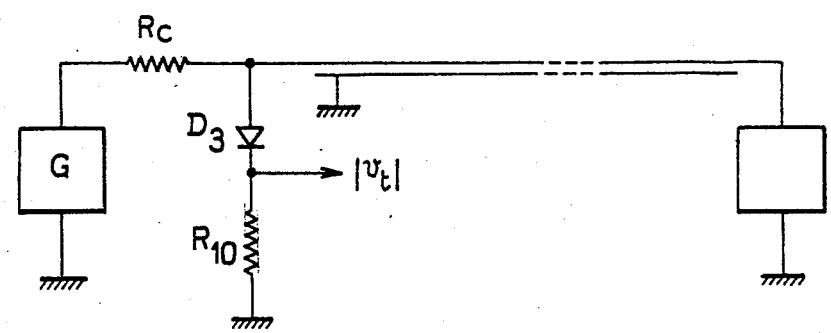
FIG_7
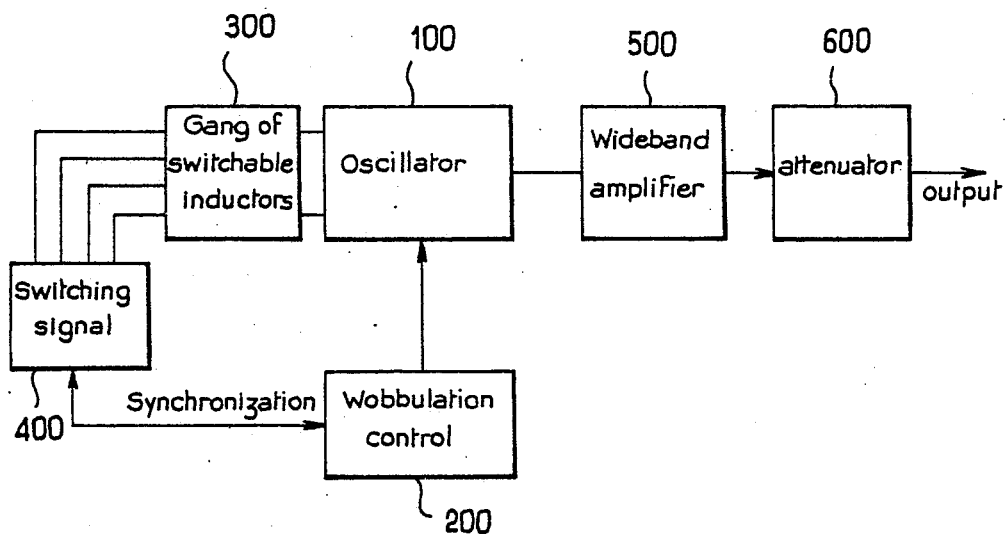
FIG_8

FIG_13

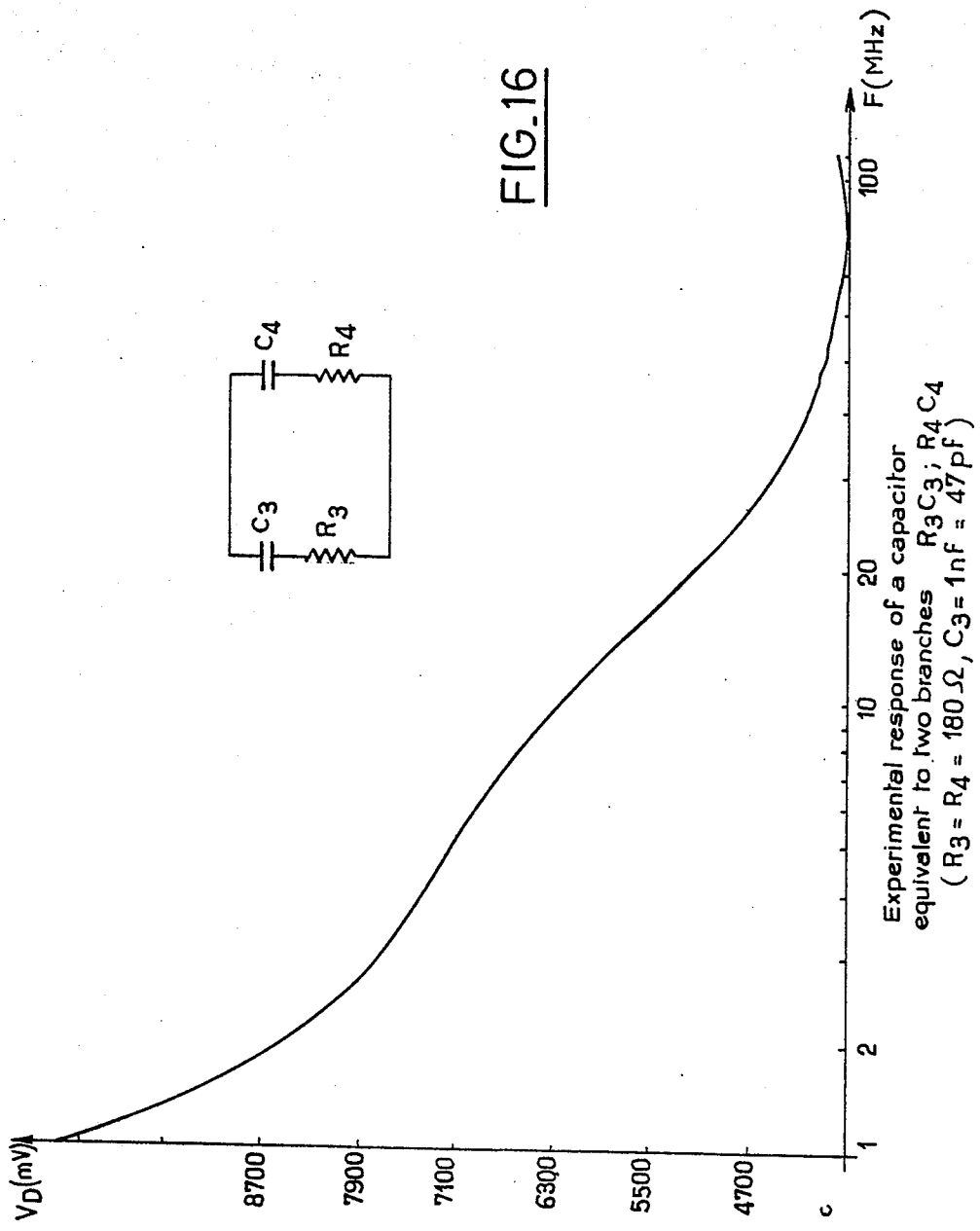

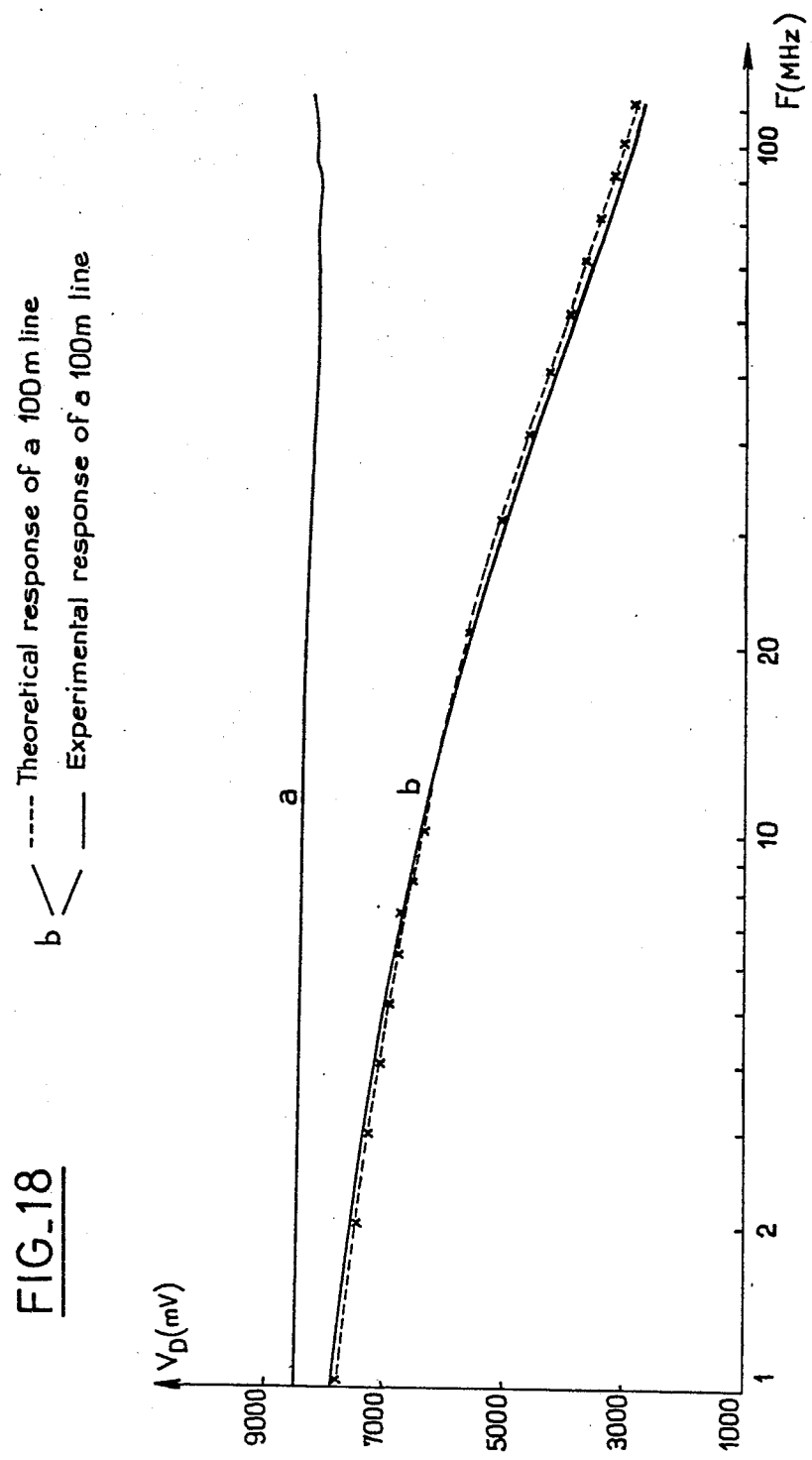
FIG_18 a) Response at the input of the line to an open circuit
b) Response to a matched load ( R = 50 Ω )

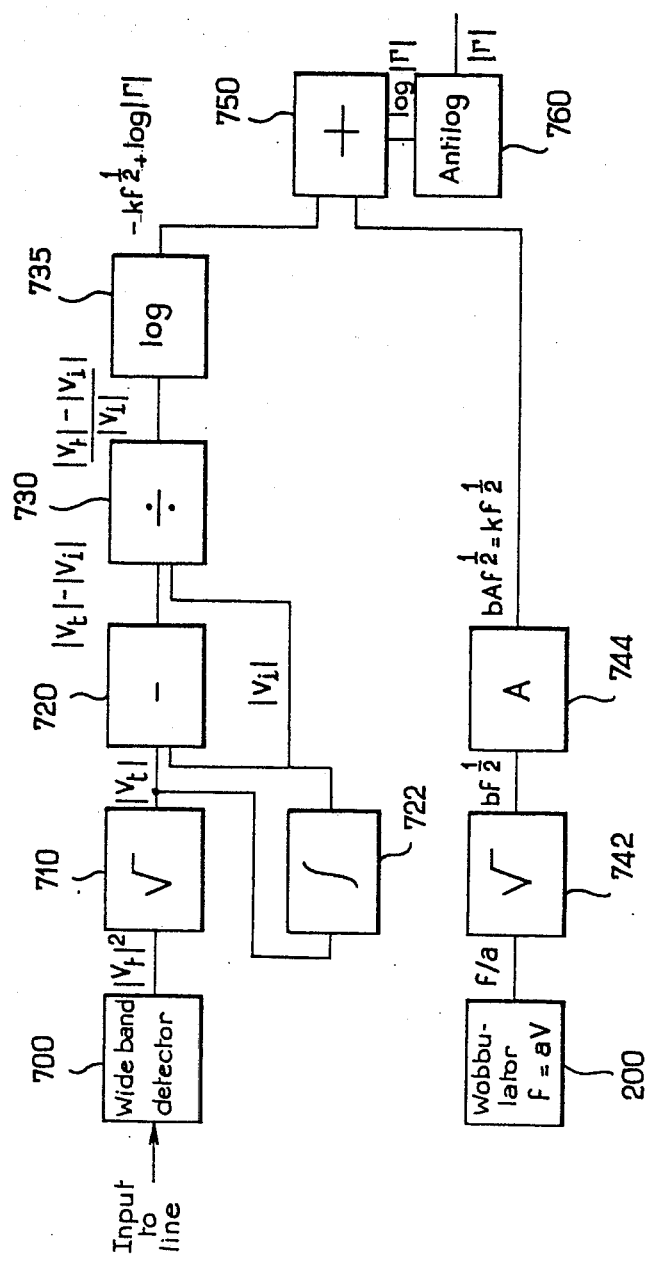
FIG._23

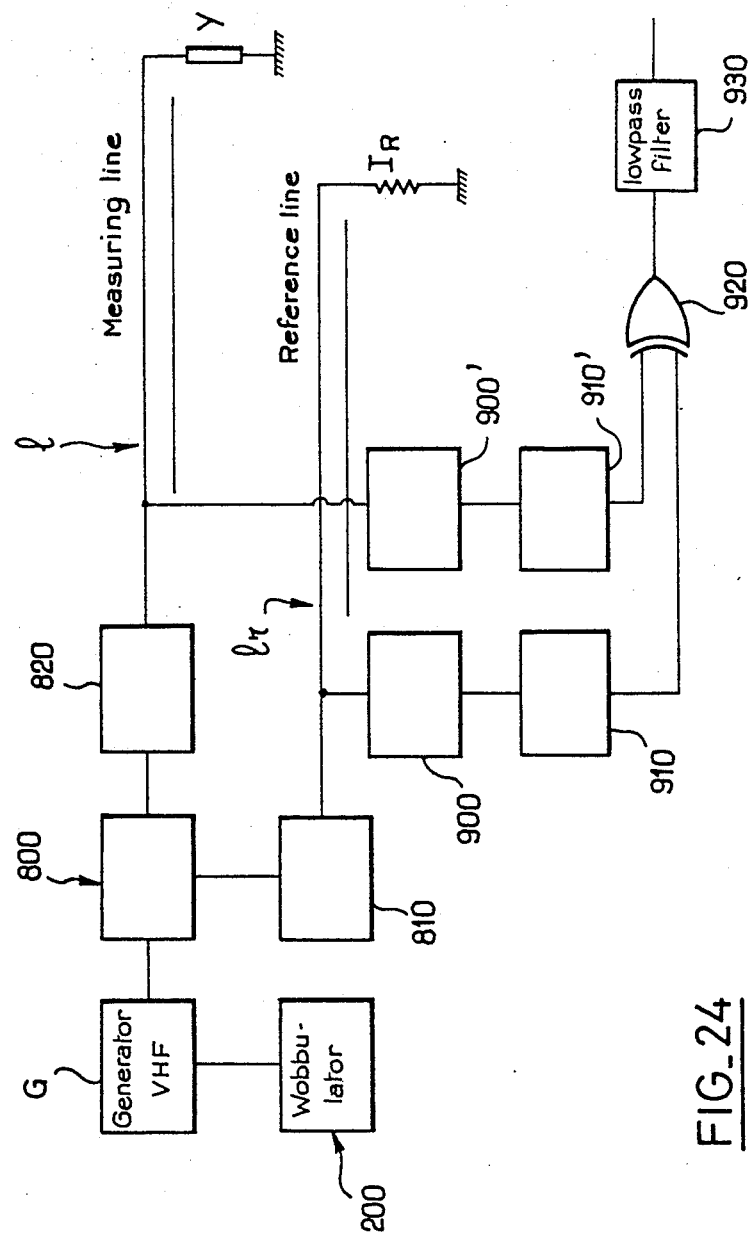
FIG_24

METHOD AND APPARATUS FOR RAPIDLY TESTING PASSIVE COMPONENTS BY REFLECTOMETRY IN THE VHF RANGE

The present invention relates to testing passive two-terminal devices, and in particular to testing capacitors.

More precisely, the present invention relates to a method and to apparatus for rapidly testing passive components by reflectometry in the VHF range.

The first aim of the present invention is to provide a device for rapidly testing passive two-terminal devices in the VHF range by means which are cheap and technologically simple.

Another aim of the present invention is to enable the two-terminal device under test to be located at a distance from the measurement electronics by using a transmission line, thereby enabling components to be tested under external stresses such as large temperature variations in a climatic test chamber, for example.

Another aim of the present invention is to acquire data covering the VHF frequency range, say from about 1 MHz to about 200 MHz very quickly, for example in about one second.

Another aim of the present invention is to make the test process easy to automate.

SUMMARY OF THE INVENTION

These various aims are achieved, according to a first aspect of the present invention, by means of a method for rapidly testing passive two-terminal devices in the VHF range, said method comprising the steps of:

(i) providing a distributed constant transmission line, connecting the head of said line to an electric signal generator capable of generating frequencies in the VHF range, and advantageously capable of varying its frequency within said range, and connecting the two-terminal device to be tested to the other end of the line as a terminating impedance;

(ii) using the generator to feed the line with a periodic incident wave $v_i$ whose frequency lies in the VHF range and which is advantageously modulated within said range while the test is being performed; and (iii) detecting, at the head of the line, a signal related to the wave $v_r$ reflected by the device under test and a second signal representative of the incident wave $v_i$ with a reflectometry module connected between the generator and the line, in order to determine the behavior of the reflection coefficient $\Gamma$ in the VHF range, and to deduce the impedance of the two-terminal device therefrom.

In accordance with the present invention, the reflectometry module is advantageously constituted by a resistive $\pi$ network having the same characteristic impedance as the internal impedance of the generator and the characteristic impedance of the line.

More precisely, in accordance with the present invention, the first signal representative of the reflected wave $v_r$ is taken between the point where the reflectometry module is connected to the line and an intermediate point on the upstream leg of the resistive $\pi$ module, whereas the second signal representative of the incident wave $v_i$ is taken between the point where the reflectometry module is connected to the generator and an intermediate point from the downstream leg of the resistive $\pi$ module.

More precisely, and in accordance with the present invention, the two legs of the resistive $\pi$ network are preferably identical, with each cell constituted by the characteristic impedance of the line connected in parallel with one of the legs of the resistive $\pi$ network having an impedance which is identical to the impedance of that portion of each of said legs which extends between the intermediate point and ground, and with the resistance interconnecting the legs of the $\pi$ network having an impedance identical to the impedance of the remaining portion of each leg of the network extending between said intermediate point and the inlet to or the outlet from the network.

In the presently preferred embodiment of the present invention, the two legs of the resistive $\pi$ network are identical and each of them comprises two resistors connected in series, a first resistor being connected between said intermediate point of each leg and ground, and a second resistor being connected between said intermediate point and the inlet to or the outlet from the network, the first resistors of each leg of the $\pi$ network having a value of $\frac{2}{3} R_c$ and the second resistors of each leg of the $\pi$ network having a value of $4/3\ R_c$ where $R_c$ is the characteristic impedance of the line.

According to a second aspect of the present invention, the above aims are achieved by means of a method for rapidly testing passive two-terminal devices in the VHF range, said method comprising the steps of:

(i) providing a long distributed constant transmission line, connecting the head of said line to an electric signal generator capable of generating frequencies in the VHF range, and advantageously capable of varying its frequency within said range, and connecting the two-terminal device to be tested to the other end of the line as a terminating impedance;

(ii) using the generator to feed the line with a periodic incident wave $v_i$ whose frequency lies in the VHF range and which is advantageously modulated within said range while the test is being performed; and (iii) detecting the total voltage at the head of the line and representative of the sum of the reflected wave $v_r$ and the incident wave $v_i$ in order to determine the behavior of the reflection coefficient $\Gamma$ in the VHF range, and to deduce the impedance of the two-terminal device therefrom.

The long line may be 100 meters long, for example.

Advantageously, step (iii) consists in detecting the maxima and the minima in the total voltage $v_t$, with the envelope of the curves:

$$\left| \frac{v_r(w)}{v_i(w)} \right|_M - 1 \tag{4}$$

$$1 - \left| \frac{v_r(w)}{v_i(w)} \right|_m \tag{5}$$

representing the function $|\Gamma(w)|$ of the reflection coefficient to within a factor of $e^{-2\alpha(w)l}$, where $\alpha(w)$ represents the attenuation.

According to an advantageous characteristic of the invention, the line is fed during step (ii) by a periodic incident wave $v_i$ whose period varies over a range from about 1 $\mu$s to about 5 ns over a test period of about 1 second.

According to the invention, it is advantageous for the line to be fed during step (ii) by an incident wave $v_i$ whose period is modulated by wobbulation in the VHF range using a linear or a logarithmic function of time.

The rapid test method in accordance with the present invention is particularly applicable to testing capacitors for which the modulus of the admittance $|Y|$ of the two-terminal device occupies a series of levels of value $G_j$ which levels are determined during step (iii) on the basis of the following equation:

$$G_j = \frac{1}{R_c} \frac{1 - |\Gamma_j|}{1 + |\Gamma_j|} \text{ where} \quad (1)$$

$R_c$ is the characteristic impedance of the line, and $|\Gamma_j|$ is the modulus of the reflection coefficient.

Still more precisely, the rapid test method in accordance with the present invention is capable of analyzing capacitors in the form of an n branch ladder network where each of the parallel-connected "rungs" of the network is constituted by a resistance $R_j$ connected in series with a capacitance $C_j$, with the resistance $R_j$ and capacitance $C_j$ being determined during step (iii) on the basis of the following equations:

$$1/R_j = G_j - G_{j-1} \quad (2)$$

where $G_j$ and $G_{j-1}$ are two successive levels in the modulus of the admittance $|Y|$, and $$C_j = (G_j - G_{j-1})/w_j \quad (3)$$

where $w_j$ is the resonant angular frequency of the j-th branch of the network.

In accordance with an advantageous characteristic of the present invention, step (ii) is performed using a variable frequency oscillator with automatic frequency band switching integrated in the generator.

In accordance with another advantageous characteristic of the invention, the oscillator wavetrap circuit is associated with a varicap diode which is biased by a sawtooth signal for wobbulating within each frequency band, with the oscillator wavetrap circuit comprising a plurality of inductors which are switched progressively into or out of operation in order to switch between frequency bands.

In accordance with a preferred characteristic of the present invention, the frequency band switching signals for progressively switching the inductors into or out from the oscillator wavetrap circuit are generated from the sawtooth signal which biases the varicap diode. This automatically synchronizes frequency band switching and wobbulation within each of the frequency bands.

According to another advantageous characteristic of the present invention, the frequency band switching signals are generated at the outputs from a serial-in, parallel-out shift register controlled by the sawtooth signal generator.

The present invention also provides apparatus for rapidly testing passive two-terminal devices in the VHF range, said apparatus comprising, in a first aspect:

an electric signal generator capable of generating a variable frequency in the VHF range;

a resistive reflectometry module connected to said generator to receive said variable frequency; and a distributed constant transmission line having its head connected to said reflectometry module to receive said variable frequency, and having its output connected to the two-terminal device to be tested, which device constitutes a terminating impedance for the line;

said reflectometry module being suitable for separating the total signal present at the transmission line head when said line is fed with a periodic incident wave $v_i$ whose frequency is modulated in the VHF range for the test duration, into a first signal representative of the reflected wave $v_r$ and a second signal representative of the incident wave $v_i$, thereby enabling the behavior of the reflection coefficient F in the VHF range to be determined, and thus enabling the impedance of each of n parallel branches of a ladder network representative of the device under test to be deduced.

The present invention also provides apparatus for rapidly testing passive two-terminal devices in the VHF range, said apparatus comprising, in a second aspect:

an electrical signal generator capable of generating a variable frequency in the VHF range;

a long distributed constant transmission line having its head connected to said generator to receive said variable frequency, and having its output connected to the two-terminal device to be tested, which device constitutes a terminating impedance for the line; and means at the head of the line for detecting the total voltage $v_t$ representative of the sum of the reflected wave $v_r$ and the incident wave $v_i$, with the incident voltage $v_i$ being monitored, while said line is being fed with a periodic incident wave $v_i$ whose frequency is modulated in the VHF range for the test duration, thereby enabling the behavior of the reflection coefficient F in the VHF range to be determined, and thus enabling the impedance of each of n parallel branches of a ladder network representative of the device under test to be deduced.

BRIEF DESCRIPTION OF THE DRAWINGS

Embodiments of the invention are described, by way of example with reference to the accompanying drawings, in which:

FIG. 1 shows the general principle of a test in accordance with the present invention;

FIG. 2 is a circuit diagram showing the standard Foster equivalent circuit for a non-ideal capacitor;

FIG. 3 is a graph showing the modulus $|Y_i|.R_i$ of the admittance of a branch in the above equivalent circuit, as a function of frequency;

FIG. 4 is a graph showing the argument of the admittance for the same branch of the equivalent circuit;

FIG. 5 is a circuit diagram of a reflectometry module in accordance with the present invention and suitable for separating the reflected wave $v_r$ and the incident wave $v_i$;

FIG. 6 is a more detailed diagram of the reflectometry module;

FIG. 7 is a diagram showing the structure of the test apparatus when using a second technique for separating the incident wave and the reflected wave, by means of reflectometry on a long line;

FIG. 8 is a block diagram of a generator used in test apparatus in accordance with the present invention;

FIGS. 14 to 21 are graphs showing the results of various measurements performed in accordance with the present invention;

FIG. 23 is a block diagram of a corrector circuit for use with the above detector circuit; and FIG. 24 is a block diagram of a circuit for determining the phase of the impedance connected to the end of the line.

GENERAL PRINCIPLES OF PERFORMING A TEST IN ACCORDANCE WITH THE PRESENT INVENTION

Figure 9:
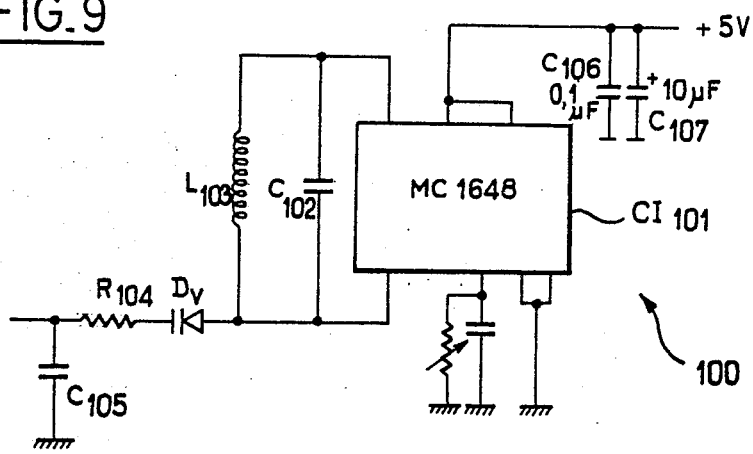
FIG. 9 is a circuit diagram of the integrated oscillator used in the above generator circuit.

As shown diagrammatically in FIG. 1, the test method in accordance with the present invention uses an electric signal generator G for generating a variable frequency in the VHF range, and the generator G is connected to the head of a distributed constant transmission line whose output is connected to the two-terminal device to be tested which appears as the terminating impedance of the line.

The general principle of the test consists in feeding the distributed constant line L of length l with a periodic incident wave $v_i$ whose period is caused to vary, for example from 1 $\mu$s to 5 ns during the very short duration of the test, i.e. for about 1 second. The period is varied by wobbulating according to a linear or a logarithmic function of time. The wave $v_r$ reflected by the device under test which is inserted as a terminating impedance for the line is then detected at the head of the line.

In FIG. 1, the detector instrument for detecting the wave $v_r$ reflector by the two-terminal device is shown diagrammatically at D.

The assembly comprising the generator G and the detector D and as seen from the input to the line L has an internal impedance equal to the characteristic impedance $R_c$ of the line (and advantageously $R_c$=50 ohms), thereby providing a matched input to the line.

As mentioned above and as described in greater detail below, the incident wave $v_i$ and the reflected $v_r$ may be separated in accordance with the present invention either by means of a resistive reflectometer module or else by reflectometry on a long line.

GENERAL ANALYSIS OF PASSIVE LINEAR TWO-TERMINAL NETWORKS

A passive linear two-terminal network is a network having two access terminals with a lattice of n branches connected therebetween. Each branch is constituted by a resistance, an inductance, and a capacitance connected in series, with one or more of these impedance elements being capable of taking values of zero or infinity.

The interaction between the two-terminal network and the electric circuit in which it is inserted is completely characterized by its admittance Y or its impedance Z, and the real internal structure of the network may be ignored.

When a two-terminal network is constituted solely by two types of element: i.e. inductance and capacitance; or inductance and resistance; or capacitance and resistance; Foster's theorem is applicable thereto. This means that the real two-terminal network may be replaced at all frequencies by a standard network whose behavior as seen from the outside is exactly equivalent thereto.

For a non-ideal capacitor, i.e. a capacitor having losses equivalent to purely resistive impedances, the standard Foster equivalent admittance circuit is shown in FIG. 2.

More precisely, the standard equivalent circuit comprises a ladder network comprising n parallel branches each of which comprises a resistance $R_i$ and a capacitance $C_i$ connected in series.

The admittance Y of the two-terminal network is given by the equations:

$$Y = \sum_{i=1}^{n} Y_i \text{ where} \tag{6}$$

$$Y_i = \frac{jC_i w}{1 + jR_i C_i w} \tag{7}$$

FIGS. 3 and 4 are graphs plotted as a function of $w/w_i$, with FIG. 3 showing the modulus $|Y_i|.R_i$ of the admittance of a branch of the network shown in FIG. 2 and with FIG. 4 showing the argument of the admittance $Y_i$.

The behavior of the i-th branch is characterized by the value of its time constant $T_i=R_i C_i$, relative to the angular frequency w.

As can be seen from FIGS. 3 and 4, when $w<1/T_i$, the branch under consideration has a capacitive admittance tending to zero with decreasing w.

However, for an angular frequency $w>1/T_i$, the branch under consideration has a limiting conductance which tends towards a constant asymptote $1/R_i$ with increasing w.

Finally, when the angular frequency $w \approx 1/T_i$, the branch in question has an admittance whose modulus and phase are varying fast, as can be seen in accompanying FIGS. 3 and 4 respectively.

The zone of variation extends over about one-and-a-half frequency decades about the resonant angular frequency $w_i = 1/T_i$. At lower frequencies the branch provides substantially zero contribution to the total admittance Y and tends to behave like an open circuit. At higher frequencies, the branch adds a conductance $1/R_i$ to the overall admittance.

If two or more branches have resonant frequencies $w_i$ within the same one-and-a-half decade interval, i.e. if they "overlap", it is shown that their contribution to the overall admittance Y may be satisfactorily represented to within a few percent by just two branches $Y_a$ and $Y_b$ whose characteristics $R_a$ & $C_a$ & $R_b$ and $C_b$ are average values of the characteristics $R_i$ & $C_i$ of the n branches in question, in other words:

$$\sum_{i=j}^{k} Y_i \simeq Y_a + Y_b \tag{8}$$

Observing the modulus $|Y_i(w)|$ of the admittance of a branch having a time constant $T_i$ with a variation in angular frequency covering one-and-a-half decades about the resonant frequency $w_i=1/T_i$ suffices for determining the characteristic parameters $T_i$ and $1/R_i$, and consequently for determining $C_i$.

Similarly, measuring the modulus of the admittance $|Y(w)|$ over an angular frequency interval of 2.3 decades suffices for determining the characteristics $R_aC_a$, $R_bC_b$, $R_dC_d$ of a three-branch equivalent circuit which is adequate for describing the behavior of the two-terminal device under test both in modulus and in phase (or conductance and susceptance) over the frequency range under consideration.

The general principle for determining the parameters $R_i$ and $C_i$ is described in French patent application No. 84 07196 filed 10 May 1984 in the name of the present Assignee, and published under the No. 2 564 205. Reference can usually be made to the description of that prior patent specification in order to obtain a better understanding of the present invention.

THE GENERAL PRINCIPLE FOR OBTAINING THE ADMITTANCE OF A TWO-TERMINAL NETWORK BY REFLECTOMETRY

The description begins with the general equations used for obtaining the admittance of a two-terminal network by reflectometry.

The following symbols are used in these equations:

$v_i$ the incident voltage applied to the line L by the generator G;

$v_r$ the voltage reflected by the two-terminal network acting as a terminating impedance at the inlet to the line;

l the length of the line (in the present typeface, lower case "L" is distinguished from the digit "one" by the serif at the top of the symbol: it slopes on the digit "1", but not on the letter "l");

Y the unknown admittance under test;

Γ the reflection coefficient due to the admittance Y;

$R_c$ the characteristic resistance of the line;

$\gamma = \alpha + j\beta$ the propagation constant;

$\alpha(w)$ the attenuation, which is a known function of frequency and practically zero for a short length of line;

$\beta = w/v$ the phase constant; and v the speed of propagation.

The equations are as follows:

$$\Gamma = (1 - R_cY)/(1 + R_cY) \text{ whence} \quad (9)$$

$$Y(jw) = \frac{1}{R_c} \frac{1 - \Gamma(w)}{1 + \Gamma(w)} = \frac{1}{R_c} \frac{1 - (v_r/v_i)e^{2\gamma l}}{1 + (v_r/v_i)e^{2\gamma l}} \quad (10)$$

$$|\Gamma| = \left|\frac{v_r}{v_i}\right| e^{2\alpha(w)l} \text{ and} \quad (11)$$

$$\arg \Gamma = \arg \frac{v_r}{v_i} + \frac{2l}{v} w \quad (12)$$

The total voltage $v_t$ at the inlet to the line can be written:

$$v_t = v_i + v_r = v_i(1 + \Gamma e^{-2\gamma l}) \quad (13)$$

Also:

$$\cos \phi = \frac{|v_t|^2 - (|v_i|^2 + |v_r|^2)}{2|v_i| |v_r|} \text{ putting} \quad (13\text{bis})$$

$$\phi = \arg(v_r/v_i) \quad (13\text{ter})$$

A NON-IDEAL CAPACITOR

When the component under test is a non-ideal capacitor being tested at an angular frequency w, all of its equvalent circuit branches whose resonant frequencies $w_i$ are less than or equal to $w/2.3$ behave as conductances $G_i = 1/R_i$, and the overall contribution of these branches 1 to $j-1$ to the admittance Y can be written:

$$G_j = \sum_{i=1}^{j-1} 1/R_i \quad (14)$$

Conversely, those equivalent circuit branches for which the resonant frequency $w_i$ is greater than 10 w have an admittance whose modulus tends towards zero and whose argument tends towards $\pi/2$. These branches have practically no effect on $|Y|$ and they behave like open circuits. The main admittance term is thus $G_j$ plus the contribution of the "active" branches whose resonant frequencies $w_i$ are close to w.

As w increases, successive branches of the equivalent circuit change from behaving as open circuits to behaving as circuits having a conductivity $1/R_i$.

The modulus of the admittance $|Y|$ thus changes in a sequence of steps of value $G_j$ separated by regions of rapid variation which correspond to the activity of the branches j whose resonant frequencies are on each side of the angular frequency:

$$w_j = 1/R_jC_j \quad (15)$$

This change in behavior is followed by the reflection coefficient. Each admittance step $G_j$ corresponds to a reflection step:

$$\Gamma_j = (1 - R_cG_j)/(1 + R_cG_j) \quad (16)$$

where the reflection coefficient is entirely real, separated by regions of rapid variation representative of the "activity" of the j-th branch in which:

$$\Gamma_j(w) = \Gamma + (\Gamma_{j-1} - \Gamma_j)/(1 + jT_jw) \quad (17)$$

where $$T_j = R_jC_j \quad (18)$$

The angular frequency $w_j$ as defined by equation (15) corresponds to a modulus:

$$|\Gamma_j(w_j)| = (\tfrac{1}{2})\sqrt{\Gamma_j^2 + \Gamma_{j-1}^2} \quad (19)$$

The following equations are thus obtained, firstly:

$$G_j = \frac{1}{R_c} \frac{1 - |\Gamma_j|}{1 + |\Gamma_j|} \text{ then} \quad (1)$$

$$1/R_c = G_j - G_{j-1} \text{ and simultaneously} \quad (2)$$

$$C_j = (G_j - G_{j-1})/w_j \quad (3)$$

The above-described procedure works well so long as the ratio between two successive time constant $T_j/T_{j-1} \geq 18$, i.e. when the active branches are clearly separated.

Rather more complex treatment is necessary when this is not true, i.e. when active branches "overlap".

However, this treatment only concerns the modulus $|Y|$.

For any given passive two-terminal network, it is sufficient to know $|v_i|$, $|v_r|$ and $|v_t|$, and obtaining the moduluses of these three voltages at a given angular frequency w is sufficient for determining $Y(w)$.

The following description deals successively with the structure of a reflectometer module proposed in accordance with the present invention for use with a first technique for separating the reflected wave $v_r$ and the incident wave $v_i$, and with a second separation technique for use on a long line.

STRUCTURE OF A REFLECTOMETER MODULE IN ACCORDANCE WITH THE PRESENT INVENTION

This reflectometer module is shown in accompanying FIGS. 5 and 6.

The reflectometer module is for inserting between the generator G having an internal impedance $R_c$ and the line having a characteristic impedance $R_c$.

In accordance with the present invention, the reflectometer module is in the form of a purely resistive $\pi$ network having a characteristic impedance $R_c$ (for example $R_c = 50$ ohms) which serves to maintain matching between the generator and the inlet to the line.

Relative to this network, it is shown that the line L as terminated by the admittance Y behaves like an output branch constituted by a resistance $R_c$ connected in series with an emf of $2v_r$ as shown to the right of FIG. 5.

This resistance reflectometer module is intended to separate the reflected wave $v_r$ and the incident wave $v_i$. The network $\pi$ network reflectometer module has two identical legs interconnected by a resistance $R_2$ whose terminals respectively constitute the input to and the output from the resistive $\pi$ network. Each of the legs of the network comprises two series-connected resistances, $R_3$ and $R_4$ in one leg and $R_5$ and $R_6$ in the other.

Also, in accordance with the present invention, each cell constituted by the characteristic impedance $R_c$ of the line connected in parallel with one of the legs $R_3$ & $R_4$ or $R_5$ & and $R_6$ of the resistive $\pi$ network has an impedance identical to the first resistance $R_4$ or $R_6$ as the case may be in each of the legs, i.e. to the resistance connected between ground and an intermediate point along the leg. Similarly, the resistance $R_2$ of the $\pi$ network which interconnects the legs thereof has an identical impedance to the second resistance $R_3$ or $R_5$ as the case may be of each leg as connected between the intermediate points thereof and the input or the output of the network as the case may be.

More precisely, in the presently preferred embodiment of the invention, as illustrated in accompanying FIGS. 5 and 6, the first resistances $R_4$ and $R_6$ of each leg of the $\pi$ network have a value of $\frac{2}{3} R_c$, and the second resistances $R_3$ and $R_5$ of each leg of the $\pi$ network and the interconnecting resistance $R_2$ have a value of 4/3 $R_c$, where $R_c$ is the characteristic impedance of the line.

Thus, the first signal representative of the reflected wave $v_r$ is taken from the point A where the reflectometer module is connected to the line and an intermediate point B in the upstream leg of the resistive $\pi$ module, whereas the second signal respresentative of the incident wave $v_i$ is taken between the point C where the reflectometer module is connected to the generator G and the intermediate point D of the downstream leg of the resistive $\pi$ module.

Application of the Thevenin and superposition theorems together with transmission line theory gives rise to the following equations:

$$v_i = E/6 \tag{20}$$

$$v_A = v_t = v_i + v_r \tag{21}$$

$$v_B = E/6 + v_r/9 = v_i + v_r/9 \tag{22}$$

$$v_A - v_B = (8/9)v_r \tag{23}$$

$$v_C - v_D = (3v_i - v_r/3) - (v_i + v_r)/3 = (8/3)v_i \tag{24}$$

The branch for detecting the modulus of the reflected wave $v_r$ comprises the following connected in series between points A and B: a diode $D_2$ whose anode is connected to the point A, and a resistance $R_8$ which is connected to the point B.

More precisely, the modulus of the reflected wave $v_r$ is detected at the intermediate point of the above-specified detection branch, i.e. at the point common to the diode $D_2$ and to the resistance $R_8$. It is detected via an inductance $L_2$.

Similarly, the branch for detecting the modulus of the incident wave $v_i$ comprises the following connected in series betweeen the points C and D: a diode $D_1$ having its anode connected to the point C, and a resistance $R_9$ connected to the point D.

More precisely, the modulus of the incident wave $v_i$ is detected at the intermediate point of the above-specified detection branch, i.e. at the point common to the diode $D_1$ and the resistance $R_g$. It is detected via an inductance $L_3$.

Inductances $L_1$ and $L_4$ are connected in parallel with the resistances $R_4$ and $R_6$ in the legs of the $\pi$ network in order to provide a ground reference for detected DC signals. These inductances $L_1$ and $L_4$ must have negligible impedance at the lowest frequency $w_m = 2\pi \cdot 10^6$ so as to avoid disturbing the operation of the reflectometer module. This condition is satisfied using inductances $L_1$ and $L_4$ having an inductance $L = 1$ mH.

Similarly, the inductors $L_2$ and $L_3$ are for transmitting the detected signals to a DC preamplifier while decoupling the network from stray capacitance in the amplifier inputs and the lines thereto. Inductance values of 1 mH are also suitable.

A branch for detecting the modulus of the total voltage at $v_t$ present at the input to the line and as defined above in equation (13) can also be seen on the right of FIG. 6.

This detection branch comprises a series connection between above-mentioned point A and ground, comprising a diode D3 whose anode is connected to point A and a resistance $R_{10}$ connected to ground.

The modulus of the voltage $V_t$ is taken from the point common to the diode $D_3$ and the resistance $R_{10}$ by means of an inductor $L_5$ which may likewise have an inductance of 1 mH.

The resistances and the diodes of the above-described reflectometer module are easily made by conventional integrated circuit techniques.

If the DC preamplifiers are not integrated in the same circuit, access leads must be provided to above-mentioned points A, B, C, D, E, F, and ground M.

However, if the DC preamplifiers are integrated in the same circuit, then access need only be provided to points A, B, C, D, and ground M.

The reflectometer module may be made using conventional integrated circuit techniques together with laser adjustment of the resistances of the resistors which may be thin-film resistors, thereby enabling the resistances to be accurately determined and also greatly reducing stray capacitance and inductance by virtue of the very small sizes of the thin-film components.

Above-mentioned equations (10), (11), and (12) can be used to determine $\Gamma$ and Y from $v_i$ and $v_r$.

LONG LIFE REFLECTOMETRY

The inventors have also developed a second reflectometry technique.

This technique uses a long line, for example L=100 meters, and it only requires the total input voltage $v_t$ to be detected together with the incident voltage $v_i$ being monitored.

This second reflectometry technique relies on the following equations in which:

$$\phi = \arg(v_r/v_i) \quad (25)$$

$$\psi = \arg \Gamma \quad (26)$$

$$v_t = v_i + v_r = v_i(1 + |\Gamma|e^{-2\alpha(w)l}e^{j(\psi - 2(l/v)w)}) \quad (27)$$

Since the line is a long line, the coefficient $2(l/v)$ has a high value, thereby causing the phase of the reflected wave $v_r$ to vary very rapidly with frequency $w$.

However, to begin with, it maybe assumed that the functions:

$$|\Gamma(w)|e^{-2\alpha(w)l} \text{ and } \psi(w)$$

vary much more slowly and remain practically constant for a $2\pi$ phase rotation in $v_r$. Under these conditions, the modulus $|v_t|$ of the reflected wave passes through a maximum at frequencies $w$ such that $$\phi = \psi(w) - 2(l/v)w = 2k\pi \quad (28)$$

and through a minimum for frequencies such that $$\phi = \psi(w) - 2(l/v)w = (2k+1)\pi \quad (29)$$

The maxima can be written:

$$|v_t/v_i|_M = 1 + |\Gamma(w)|e^{-2\alpha(w)l} \quad (30)$$

and the minima can be written:

$$|v_t/v_i|_m = 1 - |\Gamma(w)|e^{-2\alpha(w)l} \quad (31)$$

The envelope of the curves:

$$\left|\frac{v_t(w)}{v_i(w)}\right|_M - 1 \quad (32)$$

or $$1 - \left|\frac{v_t(w)}{v_i(w)}\right|_m \quad (33)$$

thus represent the function $|\Gamma(w)|$ to within the known coefficient $e^{-2\alpha(w)l}$. The argument $\psi(w)$ can also be obtained from the extreme values $w_m$ and $w_M$ using:

$$\psi_M(w_M) = 2k\pi + 2(l/v)w_M \quad (34)$$

and $$\psi_m(w_m) = (2k+1)\pi + 2(l/v)w_m \quad (35)$$

In the intervals between these angular frequencies, $\phi$ which represents the argument $v_r/v_i$ varies essentially with the linear term $-2(l/v)w$. For an angular frequency $w_M + \Delta w$ lying between the maximum $|v_t|_M$ and the immediately following minimum, $\phi$ takes the value $$\phi = \phi(w_M + \Delta w) = \psi(w_M + \Delta w) - 2(l/v)(w + \Delta w) = 2k\pi - 2(l/v)\Delta w \quad (36)$$

thus giving:

$$|v_t/v_i| = \sqrt{1 + |\Gamma|e^{-4\alpha(w)l} + 2|\Gamma|e^{-2\alpha(w)l}\cos\phi} \quad (37)$$

With a line length of 100 meters and a speed of propagation of $2.10^8$ m/second, the linear term $2(l/v)\Delta w$ present in $\phi$ and due to the line causes the phase to change by $\pi$ for a variation in frequency of 0.5 MHz.

A resonant two-terminal network having a high Q factor can cause the phase to vary even more quickly, but only over a narrow frequency range. This resonance frequency range is thus easily observed by detecting an abnormal distribution in the phase $\phi$ relative to the linear $-2(l/v)w$ term.

FIG. 7 is a diagram of a circuit for use in this long line reflectometry technique.

The circuit is very simple. It simply comprises a single branch for detecting the modulus of the voltage $v_t$ at the head of the line.

This detection branch is symbolized in FIG. 7 by a diode $D_3$ with its anode connected to the line and its cathode connected in series with a resistance $R_{10}$ which is connected to ground. This modulus $v_t$ *l is taken from the point common to the diode $D_3$ and the resistance $R_{10}$*. Extreme values of the modulus $|v_t|$ lie very close to one another along the axis, thereby enabling the voltages $|v_i|$ and $|v_r|$ to be obtained on the basis of the following equations:

$$|v_i| = \frac{|v_t|_M + |v_t|_m}{2} \quad (38)$$

$$|v_r| = \frac{|v_t|_M - |v_t|_m}{2} \quad (39)$$

STRUCTURE OF A BAND-SWITCHING GENERATOR

The inventors have developed an oscillator whose frequency can be varied over the VHF range (1 MHz to 200 MHz) using fast automatic frequency band switching in a manner which is both simple and cheap.

FIG. 8 is a block diagram of this generator.

In outline, the generator comprises an oscillator 100 associated with wobbulation control means 200 and with a block of inductors 300 which are progressively switched out of circuit by a switching signal generator 400 which generates signals which are synchronized with the wobbulation control means 200.

The generator also includes a wideband amplifier 500 connected to the output from the oscillator and feeding an attenuator 600 whose output constitutes the output from the generator.

The voltage controlled oscillator 100 may be an integrated circuit oscillator or it may be built up from discrete components.

The inductor switching system 300-400 enables the oscillator to cover a relatively wide frequency range.

By synchronizing the wobbulation signals from the means 200 and the switching signals from the means 400 it is possible to sweep monotonically through the frequency range to be covered.

An advantageous embodiment of the oscillator 100 is shown in FIG. 9.

The oscillator 100 is based on a type MC 1648 integrated circuit.

The MC 1648 is an emitter coupled logic (ECL) circuit.

It operates in conjunction with an external wavetrap which is constituted, as shown in the diagram of FIG. 9, by a cell comprising an inductance L103 connected in parallel with a capacitance C102 and associated with a variable capacitance diode $D_v$.

The variable capacitance diode $D_v$ (varicap) serves to convert the oscillator into a voltage controlled oscillator (VCO).

This is done by the anode of the varicap $D_v$ being connected to one of the terminals of the wavetrap, and by the cathode of the varicap being connected to ground via a series connection of a resistor R104 connected to the cathode and a capacitor C105 connected to ground.

The common point between the above-specified capacitor C105 and resistor R104 receives a variable bias signal which is used to vary the capacitance of the varicap $D_v$, thereby controlling the frequency of the oscillator.

The oscillator power supply is filtered by parallel connected capacitors C106 and C107.

The frequency which the MC 1648 circuit can cover is deduced from the following equation:

$$\frac{f_{max}}{f_{min}} = \frac{\sqrt{C_{Dmax} + C_s}}{\sqrt{C_{Dmin} + C_s}} \quad (40)$$

where $$f = 1/(2\pi\sqrt{L(C_D + C_s)}) \quad (41)$$

in which:
$C_s = C_{ext} + C_{int}$, with
$C_{ext}$ being the capacitance of the external shunt, and
$C_{int}$ being the shunt capacitance of the oscillator circuit (about 6 pF), and
$C_D$ being the value of capacitance presented by the varicap diode for a given bias voltage.

The output signals from the oscillator 100 are rectangular. The peak-to-peak excursion of these signals and the rising fronts thereof are set by an automatic internal control voltage.

A variable resistance connected to a "automatic gain control" (AGC) terminal serves to obtain an output wave which is generally sinusoidal.

The MC 1648 circuit has the following characteristics:
single supply rail (+5 V or −5.2 V);
a repetition frequency of up to 200 MHz;
an output voltage excursion of 800 mV into a high impedance; and
a 50% duty ratio.

As mentioned above, the VHF range of 1 MHz to 200 MHz is covered by switching inductors into or out from the resonant circuit of the oscillator 100.

Figure 10:
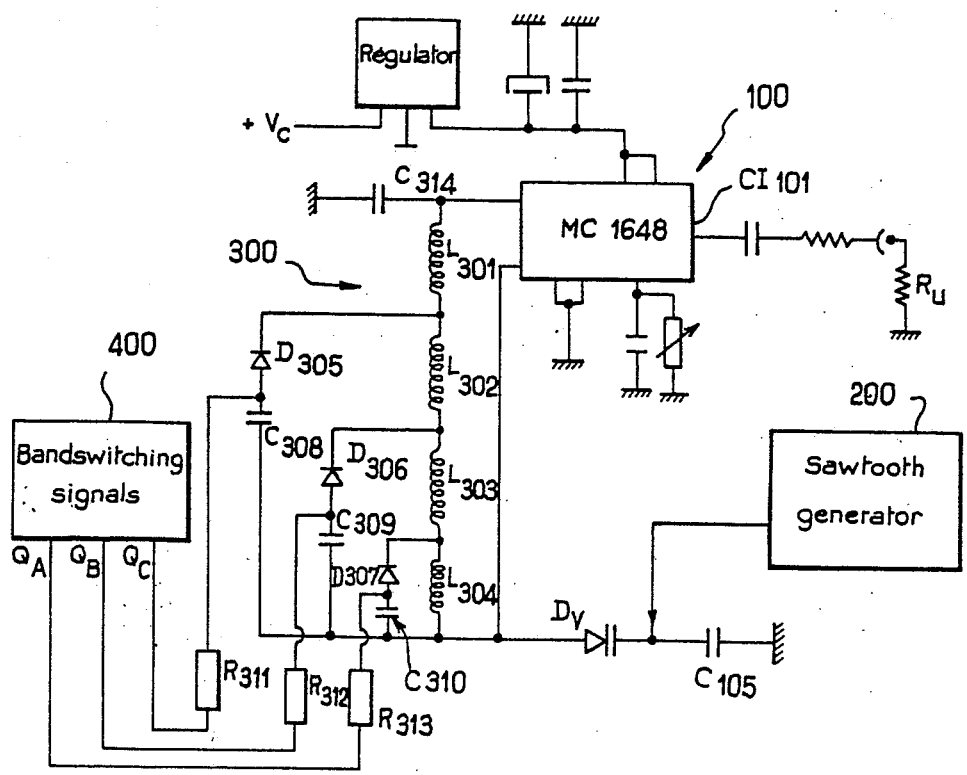
FIG. 10 is a circuit diagram of the same oscillator shown in combination with a block of switchable inductors, a band switching signal generator and a sawtooth signal generator which biases a varicap diode associated with the oscillator in order to provide wobbulation within each frequency band.

This disposition is shown in FIG. 10.

More precisely, as shown in FIG. 10, the wavetrap of the oscillator 100 is constituted by a combination of four inductors L301, L302, L303, and L304 connected in series and associated with respective capacitors C308, C309, C310, and C314, and the wavetrap is associated, as before, with the varicap diode $D_v$.

The capacitor C314 is connected between one of the terminals of the wavetrap and ground.

The capacitor C308 is connected in parallel with inductors L302, L303, and L304 via a diode D305.

The capacitor C309 is connected in parallel with inductors L303 and L304 via a diode D306.

Finally, the capacitor C301 is connected in parallel with the inductor L304 via a diode D307.

More precisely, the cathode of the diode D305 is connected to the common point between the inductors L301 and L302. The cathode of the diode D306 is connected to the common point between the inductors L302 and L303, and finally the cathode of the diode D307 is connected to the common point between the inductors L303 and L304.

The generator of band-switching signals 400 has an output $Q_C$ connected via a series resistance R311 to the common point between the anode of the diode D305 and the capacitor C308. The same switching generator 400 has an output $Q_B$ connected via a resistance R312 to the common point between the diode D306 and the capacitor D309 and a further output $Q_A$ connected via a resistance R313 to the common point between the diode D307 and the capacitor C310.

In addition, as shown in FIG. 10, the bias generator for the varicap diode $D_v$ which provides wobbulation within each frequency band of the oscillator is advantageously a sawtooth generator 200.

The inductors L301, L302, L303, and L304 are switched as follows.

To begin with, the oscillating circuit includes all four inductors L301, L302, L303, and L304 connected in series and the the varicap diode $D_v$. The varicap diode is biased by signal from the sawtooth generator 200 thereby enabling wobbulation to take place over a first frequency band $\Delta f_1$.

When the output $Q_A$ of the band-switching signal generator 400 is switched on, the inductor L304 is short circuited, thereby reducing the overall inductance in the oscillating circuit and thus increasing its resonant frequency.

The sawtooth applied to the anode of the varicap $D_v$ then provides wobbulation over a second frequency band $\Delta f_2$.

Similarly, the inductors L303 and L302 are successively short circuited by switching on outputs $Q_B$ and $Q_C$ of the band-switching signal generator 400 in order to obtain higher bands $\Delta f_3$ and $\Delta f_4$ each of which is covered by the sawtooth bias from the generator 200 as applied to the varicap diode $D_v$.

In practice, it has been observed that is is not necessary for the frequency bands $\Delta f_1$, $\Delta f_2$, $\Delta f_3$, and $\Delta f_4$ obtained by the switching to coincide exactly. In other words, a small gap may be tolerated between the various frequency bands $\Delta f_i$, which reduces the number of inductors that need to be switched.

Figure 11:
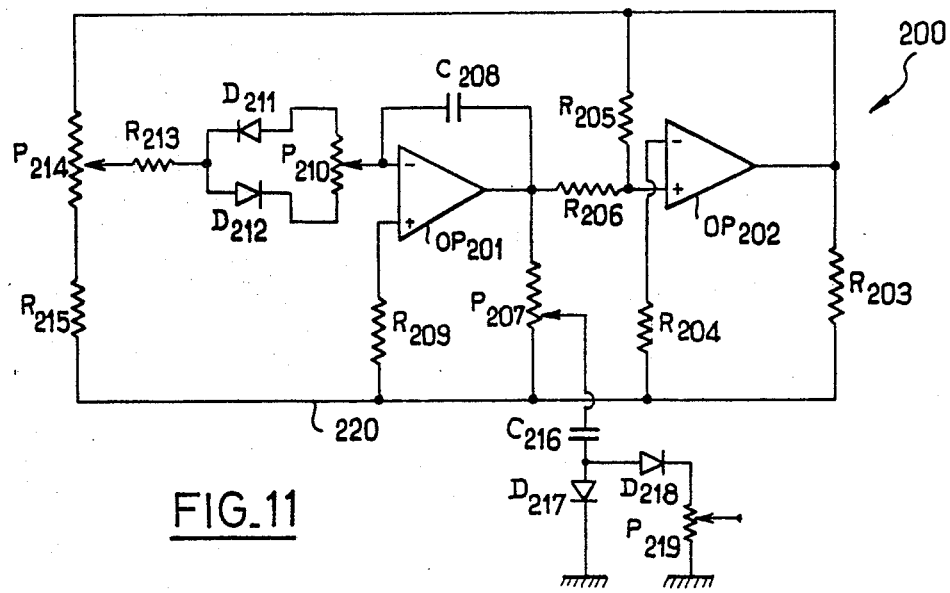
FIG. 11 is a circuit diagram of the sawtooth generator.

FIG. 11 is a circuit diagram of a sawtooth generator 200 suitable for use in the present invention.

The sawtooth generator 200 is constituted by an integrator based on an operational amplifier OP201 and on a comparator using an operational amplifier OP202.

The output from the integrator as constituted by the output from the operational amplifier OP201 supplies a linear slope which constitutes a control input to the comparator, and is therefore connected via resistor R206 to the noninverting input of the operational amplifier OP202.

The noninverting input to the operational amplifier OP202 is also connected to the output from said operational amplifier via a resistor R205.

Furthermore, the inverting input of the operational amplifier OP202 is connected to a base line 220 via a resistor R204. The output from the operational amplifier OP202 is also connected to the base line via a resistor R203.

The signal obtained at the output from the operational amplifier OP202 which is connected as a comparator and which is always either at low or at high saturation, is applied to the input of the integrator.

More presicely, the output from the operational amplifier OP202 is connected to a first terminal of a potentiometer P214 whose other main terminal is connected to the base line 220 via a resistor R215.

The inverting input of the operational amplifier OP201 is connected to the cursor of a potentionmeter P210.

The two main terminals of the potentiometer P210 are respectively connected to the anode of a diode D211 and to the cathode of a diode D212.

Further, the cathode of the diode D211 and the anode of the diode D212 are both connected in common to a first terminal of a resistor R213.

The second terminal of the resistor R213 is connected to the cursor of the first above-mentioned potentiometer P214.

A capacitor C208 connects the inverting input of the operational amplifier OP201 to the output of said amplifier.

The noninverting input of the operational amplifier OP201 is connected to the above-mentioned base line 220 via a resistor R209.

The recurrence frequency of the sawtooth signal obtained at the output from the integrator OP201 is determined by the capacitor C208 and the potentiometer C214.

The return time is adjusted by the system of diodes D211 and D212 together with the potentiometer P210.

The sawtooth signal is taken from a potentiometer P207 which is connected between the output from the operational amplifier OP201 and the base line 220.

More precisely, the cursor of the potentiometer P207 is connected to ground via a branch comprising a series connection of a capacitor C216 connected to the cursor of the potentiometer P207 and a diode D217 whose anode is connected to ground.

In addition, the common point between the capacitor C216 and the diode D217 is connected to another series connected branch comprising a diode D218 and a potentiometer P219 whose other end is connected to ground.

The cursor of the potentiometer P219 constitutes the output from the sawtooth generator 200 and is used to bias the varicap $D_v$.

The diodes D217 and D218, and the capacitor C216 serve to restore a DC component so that the output signal is positively biased.

It is highly desirable for the switching of the inductors L302, L303, and L304 to be synchronized with the wobbulation control signal from the sawtooth generator 200, and to this end the sawtooth signal is used to drive the switching signal generator.

Figure 12:
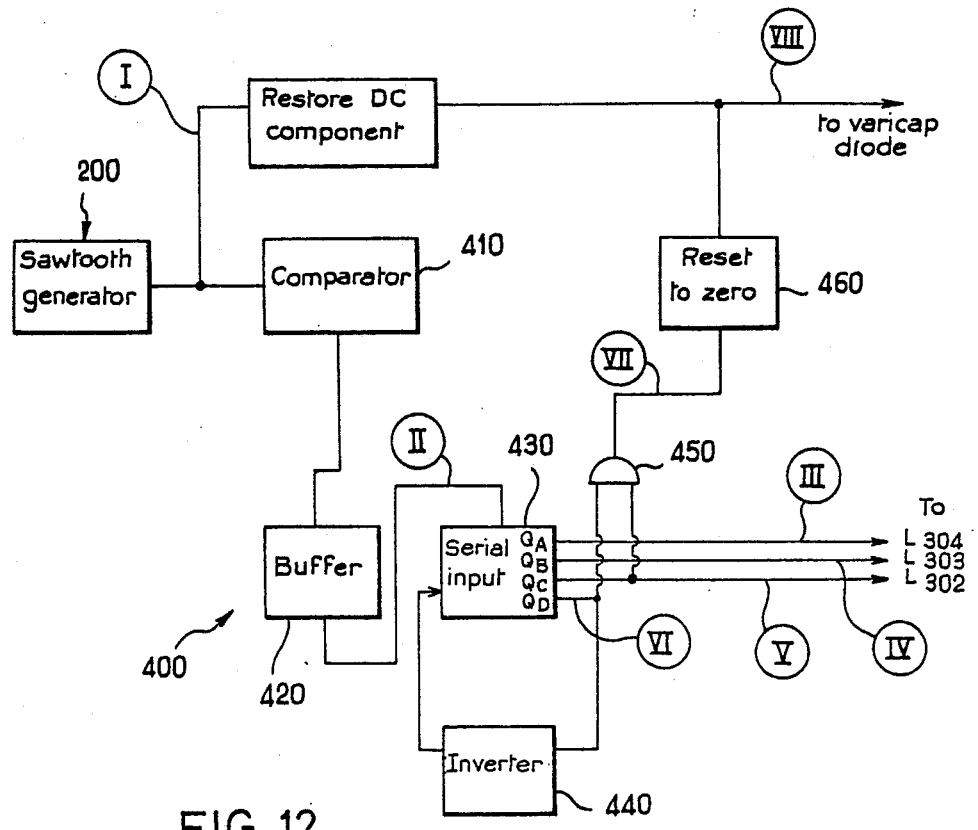
FIG. 12 is a block diagram showing the sawtooth generator and the band switching signal generator synchronized in accordance with a preferred embodiment of the present invention.

As shown in FIG. 12, a zero threshold comparator 410 is excited by the sawtooth signal from the generator 200 and generates output signals which are saturated either high or low.

A buffer stage 420 connected to the output of the comparator 410 matches these high and low saturation states to TTL logic levels and generates a clock signal for sequencing the switching of the inductors L302, L303, and L304.

In order to do this, the clock signal from the buffer state 402 is fed to a shift register 430 having a serial input and parallel outputs.

The first three outputs $Q_A$, $Q_B$, and $Q_C$ from the shift register 400 are used to switch the inductors L302, L303, and L304 as explained above with reference to FIG. 10.

The fourth output $Q_D$ from the shift register 430 is fed back to a control input thereof via an inverter 440 and is used to control desired operation of the switching cycle.

Also, the outputs $Q_D$ and $Q_C$ from the shift register 430 are used to reset the wobbulator system to zero.

To do this, the outputs $Q_D$ and $Q_C$ are connected to respective inputs of a two-input AND gate 450 whose output is connected to a reset to zero cell 460 which is connected to the varicap diode $D_v$.

Figure 13:
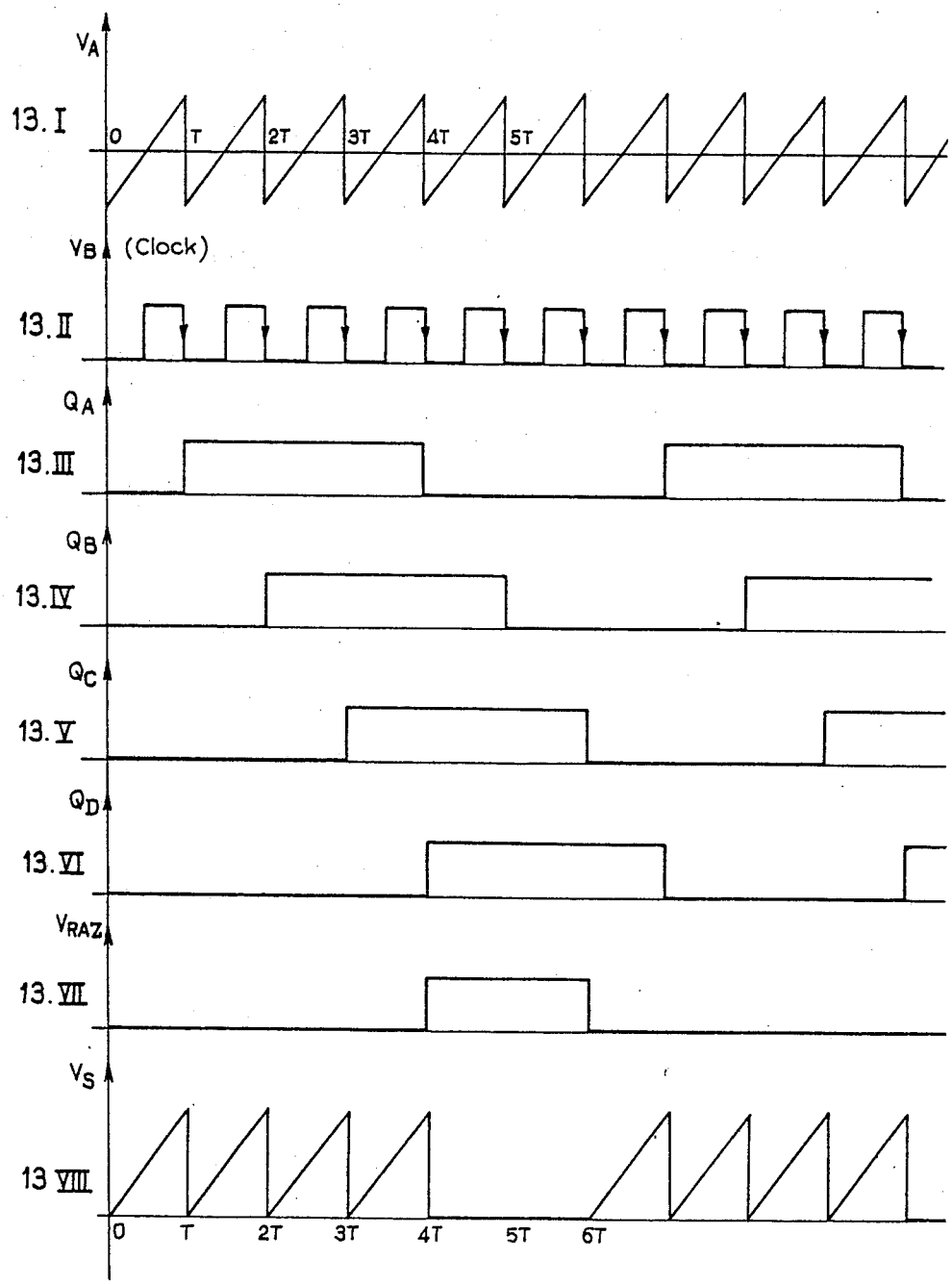
FIG. 13 is a waveform diagram showing various signals representative of the operation of a generator in accordance with the present invention.

The person skilled in the art will readily understand the operation of the above-described generator by referring to the waveform diagrams of FIG. 13.

The first line 13.I of FIG. 13 shows the sawtooth signal coming from the generator 200.

The second line 13.II of FIG. 13 shows the clock signal applied to the shift register 430.

The third, fourth, fifth and sixth lines 13.III, 13.IV, 13.V, and 13.VI of FIG. 13 show the signals available on outputs $Q_A$, $Q_B$, $Q_C$, and $Q_D$ of the shift register 430.

The seventh line 13.VII of FIG. 13 shows the reset to zero signal from the AND gate 450.

Finally, the eighth line 13.VIII of FIG. 13 shows the bias signal applied to the varicap diode $D_v$.

The waveform diagrams of FIG. 13 are described below as a function of time t and in terms of the period T of the sawtooth signal.

When $0 < t < T$, all of the inductors L301, L302, L303, and L304 are active, and the sawtooth of period T from the generator 200 causes a signal to be obtained which sweeps over a frequency band $\Delta f_1$ by varying the bias on the varicap diode $D_v$.

For $T < t < 2T$, the output $Q_A$ of the shift register 430 is in the high state, thereby forward biasing the diode D307 and thus short circuiting the inductor L304. The oscillating circuit now only comprises the inductors L301, L302, and L303, together with the varicap diode $D_v$. The oscillator has thus been switched to the next higher frequency band $\Delta f_2$. Here again, the sawtooth signal of period T which biases the diodes $D_v$ serves to sweep through the frequency band $\Delta f_2$.

When $2T < t < 3T$, the output $Q_B$ of the shift register 430 is in the high state thereby forward biasing the diode D306 and short circuiting the inductor L303. The oscillator circuit is then constituted solely by the inductors L301, L302, and the varicap diode $D_v$, thereby shifting the frequency band up to $\Delta f_3$ which is again swept through by the sawtooth bias applied to the varicap $D_v$ over a single period T thereof.

When $3T<t<4T$, the diode D305 is forward biased by the output $Q_C$ of the shift register going high, thus leaving only the inductor L301 and the varicap diode $D_v$ in the resonant circuit. This enables the sawtooth signal sweep the oscillator through the top frequency band $\Delta f_4$.

The above switching operations enable the entire desired frequency range to be covered.

Reinitialization takes place automatically at the end of the cycle. To do this, the application of signals to the varicap diode $D_v$ is inhibited by a reset to zero signal which controls the varicap via the AND gate 450 and the above-mentioned cell 460.

Naturally, the present invention is not limited to the embodiment described above but applies to any variant which falls within the scope of the claims.

USING THE MEASUREMENT RESULTS TO ANALYZE A TWO-TERMINAL NETWORK

Two cases need to be considered.

In the first case, the following measurements must first be obtained at a given frequency: $|v_t|$, $|v_i|$, and $|v_r|$.

The quantities are obtained directly by the reflectometry module.

Otherwise, when using the long line method, only $|v_t|$ is directly measured, but extreme values of $|v_i(w)|$ and 51 $v_r(w)|$ can be deduced at very close intervals from $|v_t(w)|$ by using equations (38) and (39).

The modulus $|v_r/v_i|$ is thus directly available, and the argument $\phi$ of $v_r/v_i$ can be obtained from equation (13 bis).

$Y(jw)$ is then determined using equation (10). It can be obtained without making any prior assumptions on the internal structure of the two-terminal network.

In the second case, $|v_i(w)|$ is kept constant and only $|v_r(w)|$ (in the reflectometry method) or $|v_t(w)|$ (in the long line method) is measured, from which $|v_r(w)|$ is deduced. In this case measurements must be taken over a wide range of angular frequencies and a parametric model (e.g. the Foster equivalent circuit for a non-ideal capacitor) must be assumed, and its parameters are then determined.

OVERLAP BETWEEN ACTIVE BRANCHES OF THE TWO-TERMINAL NETWORK

In equation $$\Gamma(jw) = j + \frac{\Gamma_{j-1} - \Gamma_j}{1 + jT_jw} \quad (17)$$

$\Gamma_{j-1}$ takes account of all of the contributions from branches which have been activated by sweeping through increasing w prior to reaching $w_j = 1/T_j$ (which contributions are purely real), and $\Gamma_j$ is the real value which $\Gamma(jw)$ will reach when w exceeds $w_j$ and the j−th branch ceases to be active.

The expression:

$$G(jw) = \frac{\Gamma_{j-1} - \Gamma_j}{1 + jT_jw} \quad (42)$$

may thus be considered as being an expression for the range over which the j−th branch varies. The "amplitude" $A_j$ of this range is the quantity $\Gamma_{j-1} - \Gamma_j$, which gives:

$$|G| = \frac{A_j}{1 + T_j^2 w^2} = \frac{A_j}{1 + (w^2/w_j^2)} \quad (43)$$

The frequency range over which the j-th branch varies may be defined by the interval $w_{Bj}$, $w_{Hj}$ where:

$$|G| = A_j(1-0.1) \text{ for } w_{Bj} \text{ which gives} \quad (44)$$

$$w_{Bj} = w_j \sqrt{10} \text{ and} \quad (45)$$

$$|G| = 0.1 \, A_j \text{ at } w_{Hj} \text{ i.e.} \quad (46)$$

$$w_{Hj} = \sqrt{10} \, w_j \quad (47)$$

Thus giving $w_{Hj}/w_{Bj} = 10$.

The j-th branch thus varies over a frequency range which extends over a decade of frequencies. Beyond this range, the modulus of G is within 10% of its asymptotic values.

This range always extends over a decade and is independent of the amplitude $A_j$.

Thus, if the frequency range measured between two successive steps in the curve of $|\Gamma(w)|$ between 10% marks in the amplitude $A_j$ separating the steps is greater than one decade, there must be overlapping active branches.

$A_j$ can then be considered as being the sum of the amplitudes $A_1, A_2, \ldots$ of the overlapping active branches, however the overlap has the effect of reducing the frequency range so that for two branches, for example, the total range will lie somewhere between one decade and two decades.

The expression for the reflection coefficient becomes:

$$\Gamma(w) = \Gamma + \frac{A_1}{1 + jT_1w} + \frac{A_2}{1 + jT_2w} \quad (48)$$

where: $T_1 = 1/w_1$ $T_2 = 1/w_2$; $w_1 < w_2 < 10w_1$

The overlapping frequency ranges thus include a zone where they are both "active" simultaneously. However, with increasing frequency it is the range $A_1$ which is active first so for low frequencies w close to the beginning of the overall range of variation:

$$\Gamma(w) = \Gamma + A_2 + \frac{A_1}{1 + T_1^2 w^2} - \frac{j A_1 T_1 w}{1 + T_1^2 w^2} \quad (49)$$

or for $T_1w << 1$:

$$\Gamma(w) = \Gamma + A_2 + A_1 - A_1 T_1^2 w^2 - jA_1 T_1 w, \text{ giving} \quad (50)$$

$$|\Gamma(w)| = \quad (51)$$

$$\left[ (\Gamma + A_2 + A_1)^2 \left( 1 - \frac{2A_1 T_1^2 w^2}{\Gamma + A_2 + A_1} \right) + A_1^2 T_1^2 w^2 \right]^{\frac{1}{2}}$$

or $$|\Gamma(w)| = (\Gamma + A_2 + \quad (52)$$

-continued $$A_1\left(1 - \left[\frac{A_1}{\Gamma + A_2 + A_1} - \frac{A_1^2}{2(\Gamma + A_2 + A_1)^2}\right]T_1^2 w^2\right)$$

which can be written:

$$\log|\Gamma(w)| = \log(\Gamma + A_2 + A_1) - \quad (53)$$

$$\left[\frac{A_1}{\Gamma + A_2 + A_1} - \frac{1}{2} \times \frac{A_1^2}{(\Gamma + A_2 + A_1)^2}\right]\frac{w^2}{w_1^2}$$

which is a linear relationship between $\log|F(w)|$ and $w^2$.

The slope of this line is:

$$p_1 = -\left[\frac{A_1}{\Gamma + A_2 + A_1}\left(1 - \frac{1}{2} \times \frac{A_1}{\Gamma + A_2 + A_1}\right)\right]\frac{1}{w_1^2} \quad (54)$$

Similarly for high w close to the end of the overall frequency range, only the upper term remains active, and its activity reduces to a term in $A_2/jT_2w$, so $$\Gamma(w) = \Gamma + \frac{A_2}{jT_2 w} = \Gamma - j\frac{A_2}{T_2 w} \text{ and} \quad (55)$$

$$|\Gamma(w)| = \Gamma(1 + A_2^2/2\Gamma^2 T_2^2 w^2) \text{ whence} \quad (56)$$

$$\log|\Gamma(w)| = \log\Gamma + \frac{A_2^2 w_2^2}{2\Gamma^2} \times \frac{1}{w^2} \text{ giving a slope} \quad (57)$$

$$p_2 = \frac{A_2^2 w_2^2}{2\Gamma^2} \quad (58)$$

for the line $\log|\Gamma(w)| = f(1/w^2)$

Finally, in the middle region, where $w_1 < w < w_2$, both branches are fairly close to resonance, so $w/w_1$ and $w/w_2$ are both approximately equal to 1.

For the first branch, put $w = w_1 + x$, such that $x = w - w_1$ where $x << w_1$, giving:

$$\frac{A_1}{1 + jT_1 w} = \frac{A_1}{1 + jw/w_1} = \quad (59)$$

$$\frac{A_1}{1 + j + jx/w_1} = \frac{A_1[1 - j(1 + x/w_1)]}{2(1 + x/w_1)}$$

$$\frac{A_1}{1 + jw/w_1} \simeq \frac{A_1}{2}\left[\frac{1}{1 + x/w_1} - j\right] \simeq \frac{A_1}{2}[w_1/w - j] \quad (60)$$

If the same procedure is applied to the upper branch:

$$\frac{A_2}{1 + jw/w_2} \simeq \frac{A_2}{2}\left[\frac{w_2}{w} - j\right] \text{ whence} \quad (61)$$

-continued $$|\Gamma(w)| = \left[\left(\Gamma + \frac{[A_1 w_1 + A_2 w_2]}{2w}\right)^2 + \left(\frac{A_1 + A_2}{2}\right)^2\right]^{\frac{1}{2}} \quad (62)$$

$$= \left(\frac{A_1 + A_2}{2}\right)\left(1 + \left(\frac{2\Gamma}{A_1 + A_2} + \frac{A_1 w_1 + A_2 w_2}{A_1 + A_2} \times \frac{1}{w}\right)^2\right)^{\frac{1}{2}}$$

Putting $w_M = \frac{A_1 w_1 + A_2 w_2}{A_1 + A_2}$ one obtains: $\quad (63)$ $$|\Gamma(w_M)| = \left[\left(\frac{A_1 + A_2}{2}\right)^2 + \left(\Gamma + \frac{A_1 + A_2}{2}\right)^2\right]^{\frac{1}{2}} \quad (64)$$

In the above equation both F and $A_1 + A_2 = A =$ overall amplitude in the region under consideration are known, so it can be used to find the value of $|\Gamma(w_M)|$ on the curve of $|\Gamma(w)|$. Since the angular frequency $w_M$ corresponds to the above-defined value, there are four equations for use in determining $A_1$, $A_2$, $w_1$, and $w_2$:

$$A_1 + A_2 = A \quad (65)$$

$$A_1 w_1 + A_2 w_2 = A w_M \quad (66)$$

$$p_1 = -\left[\frac{A_1}{\Gamma + A_2 + A_1}\left(1 - \frac{1}{2} \times \frac{A_1}{\Gamma + A_2 + A_1}\right)\right]\frac{1}{w_1^2} \quad (54)$$

$$p_2 = \frac{A_2^2 w_2^2}{2\Gamma^2} \quad (58)$$

Figure 14:
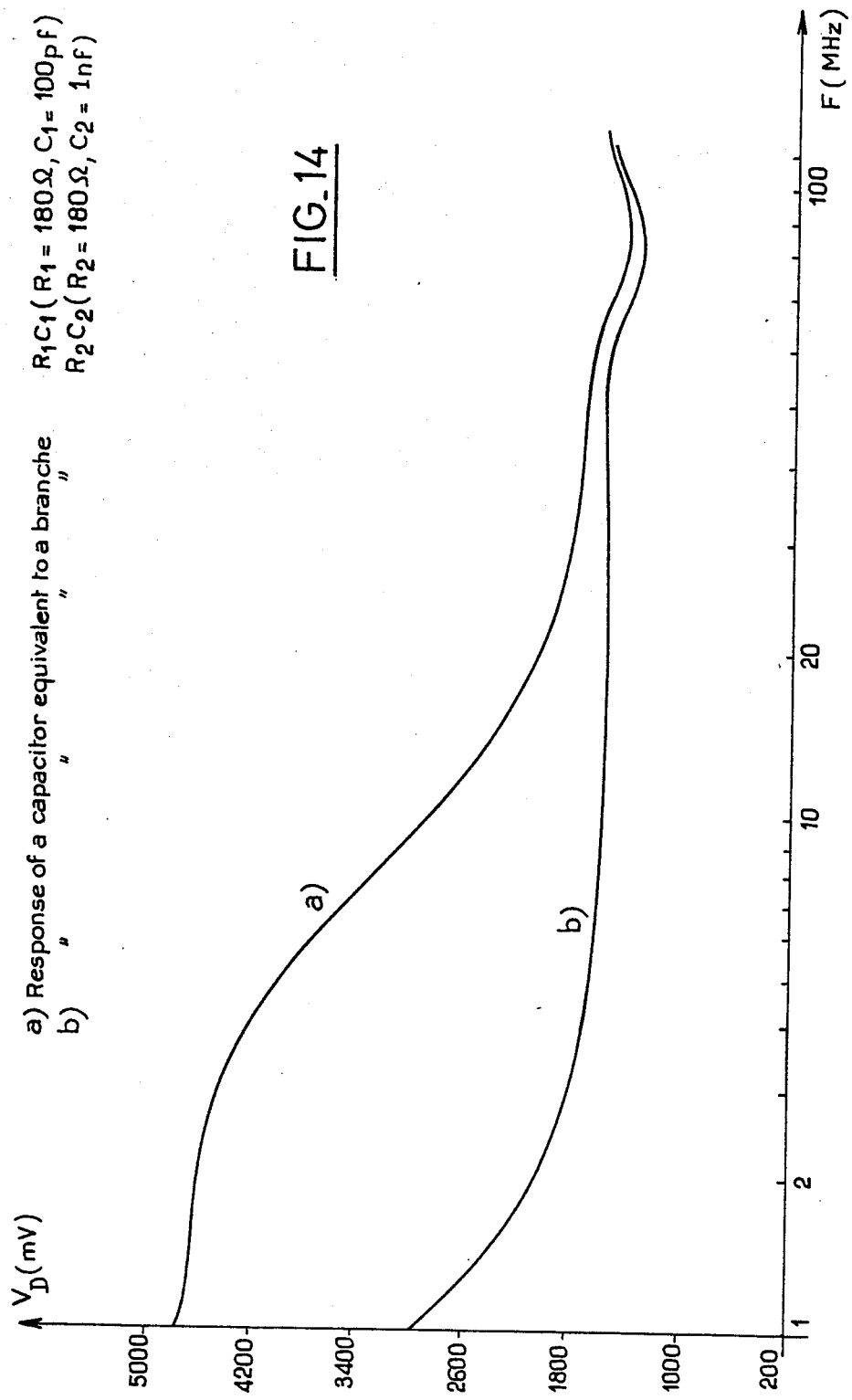

FIG. 14 plots a curve (a) of the response of a capacitor equivalent to a branch $R_1 C_1$ where $R_1 = 180$ ohms and $C_1 = 100$ pF, and a curve (b) showing the response of a capacitor equivalent to a branch $R_2 C_2$ here $R_2 = 180$ ohms and $C_2 = 1$ nF.

Figure 15:
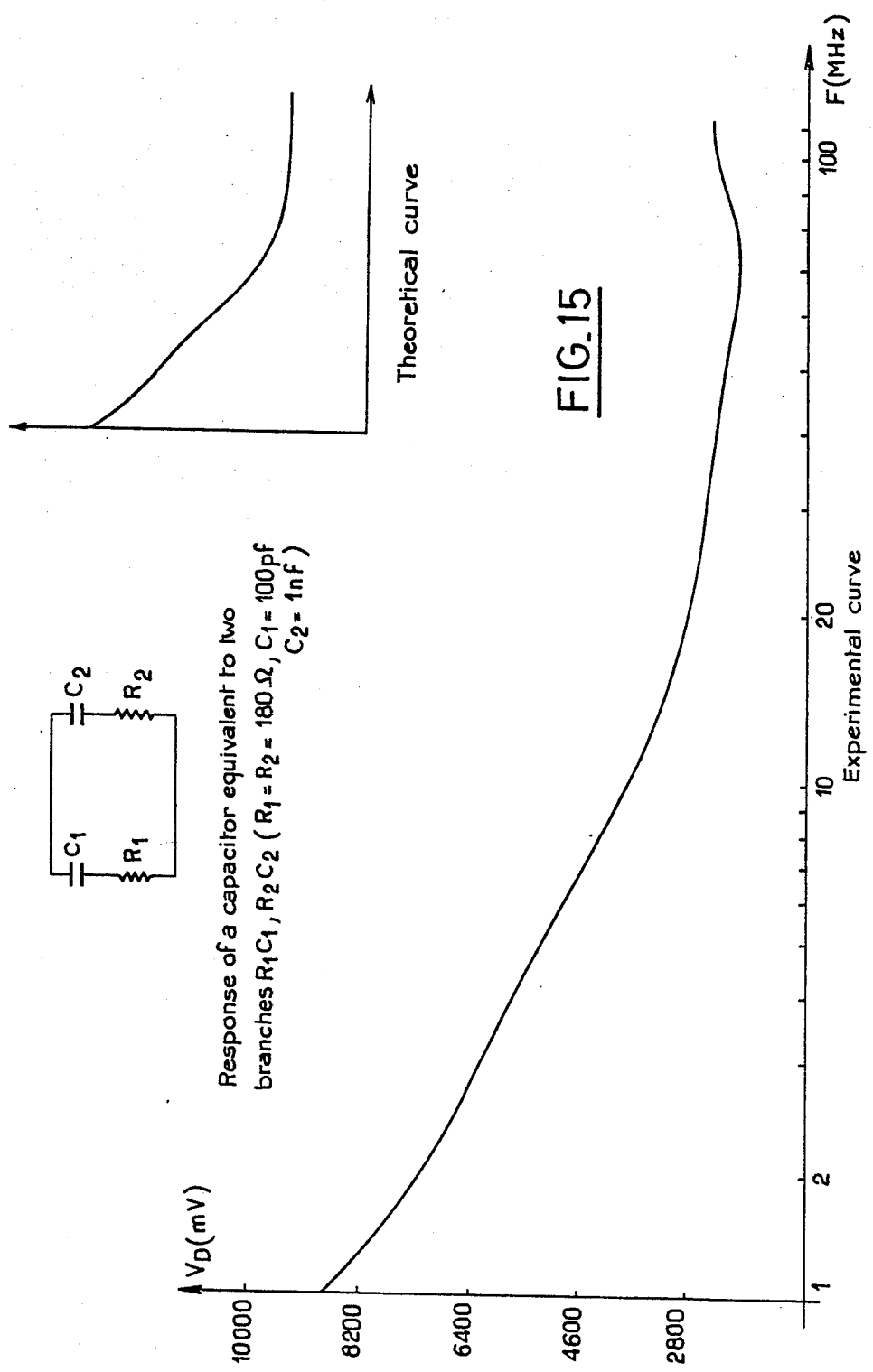

FIG. 15 shows an experimentally derived curve together with a theoretical curve for the response of a capacitor which is equivalent to two branches $R_1 C_1$ and $R_2 C_2$ with $R_1 = R_2 = 180$ ohms, and $C_1 = 100$ pF, and $C_2 = 1$ nF.

FIG. 16 shows the experimental response for a capacitor which is equivalent to two branches $R_3$, $C_3$, $R_4 C_4$ with $R_3 = R_4 = 180$ ohms, $C_3 = 1$ nF, and $C_4 = 47$ pF.

In FIGS. 14, 15, and 16, $V_D$ represents the detected reflected voltage (in mV).

$V_D$ is thus proportional to $|v_r|$ and proportional to $|\Gamma(w)|$.

Figure 17A:
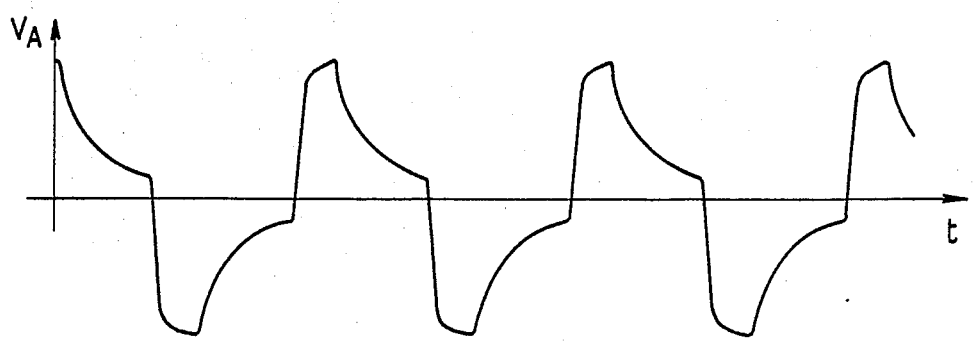
Figure 17B:
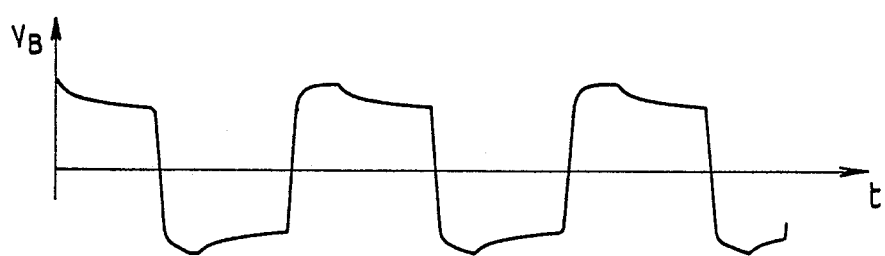
Figure 17C:
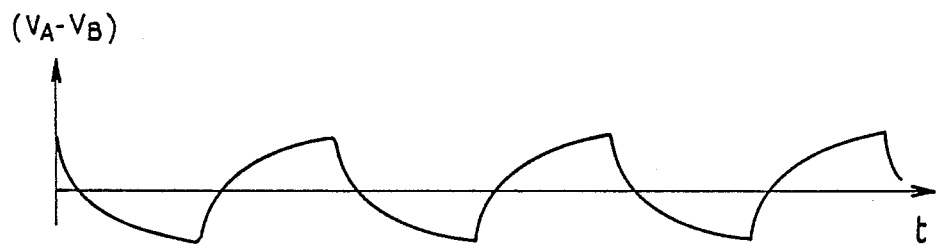

FIGS. 17A, 17B, and 17C are waveform diagrams respectively of the voltage measured at point A of the abovedescribed reflectometry module, the voltage measured at point B, and the voltage measured between points A and B.

FIG. 18 has a curve (a) plotting the experimental response of a coaxial line which is 1 m long, and a curve (b) which is shown in dashed lines showing the theoretical response of a line which is 100 m long, in conjunction with a curve (b) plotted as a continuous line which shows the experimental response of a 100 m line.

Figure 19:
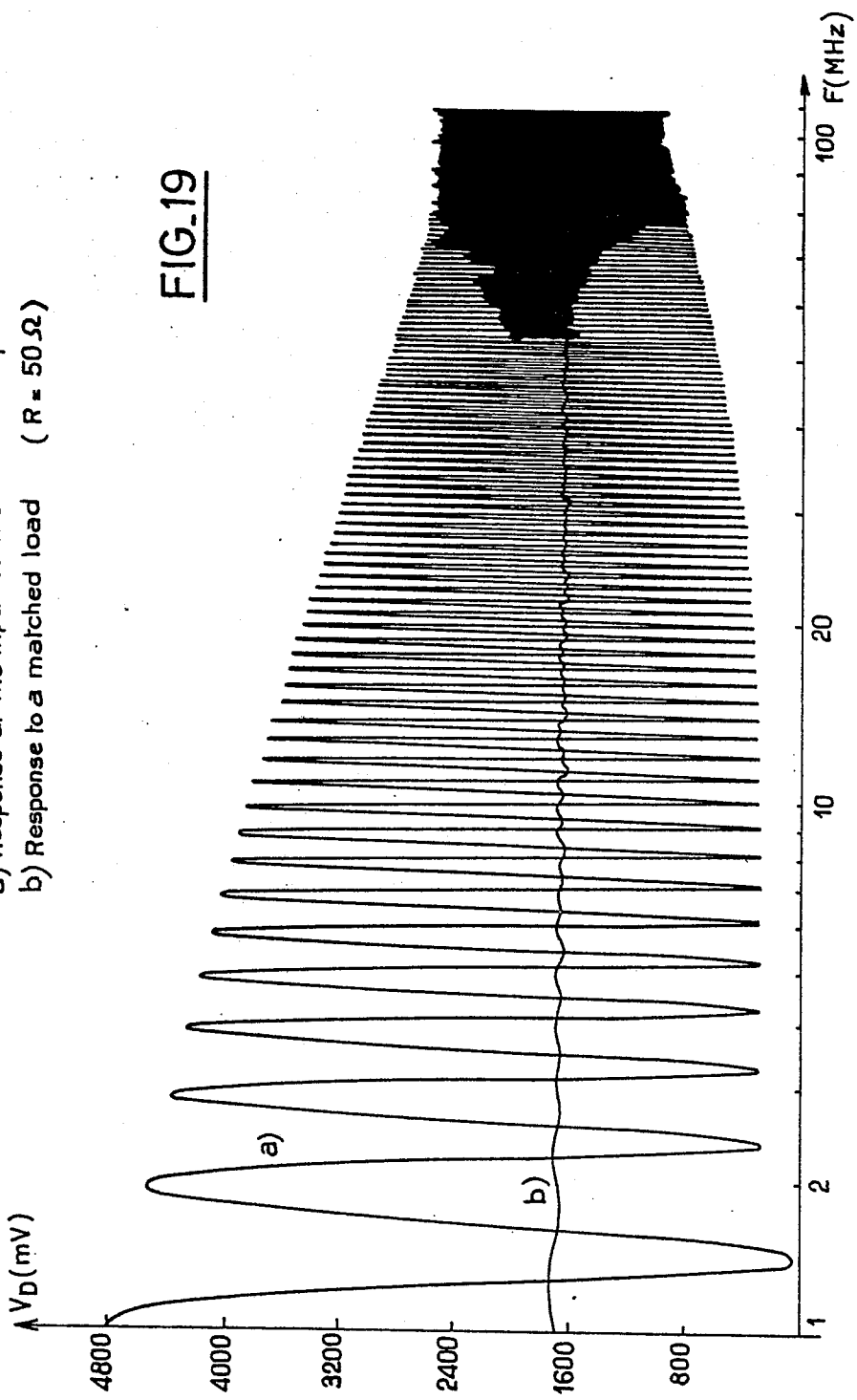

FIG. 19 shows a curve (a) plotting the response at the input to the line to an open circuit, and an curve (b) plotting the response to a matched load (R=50 ohms).

Figure 20:
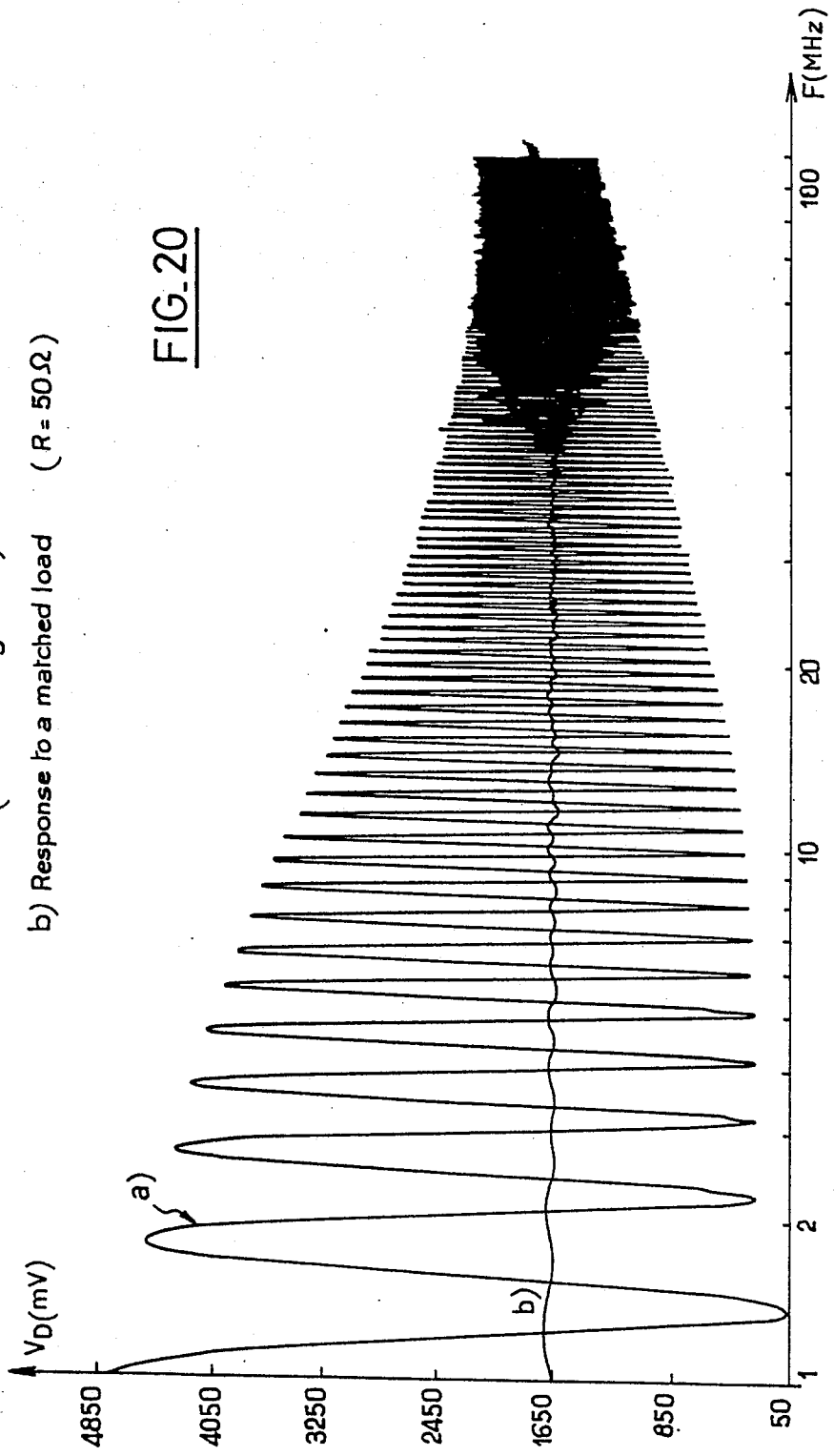

FIG. 20 shows a curve (a) plotting the response of a capacitor equivalent to a single branch $R_1C_1$ where $R_1=180$ ohms and $C_1=47$ pF (on a 100 m line) and a curve (b) plotting the response of a matched load with R=50 ohms.

Figure 21:
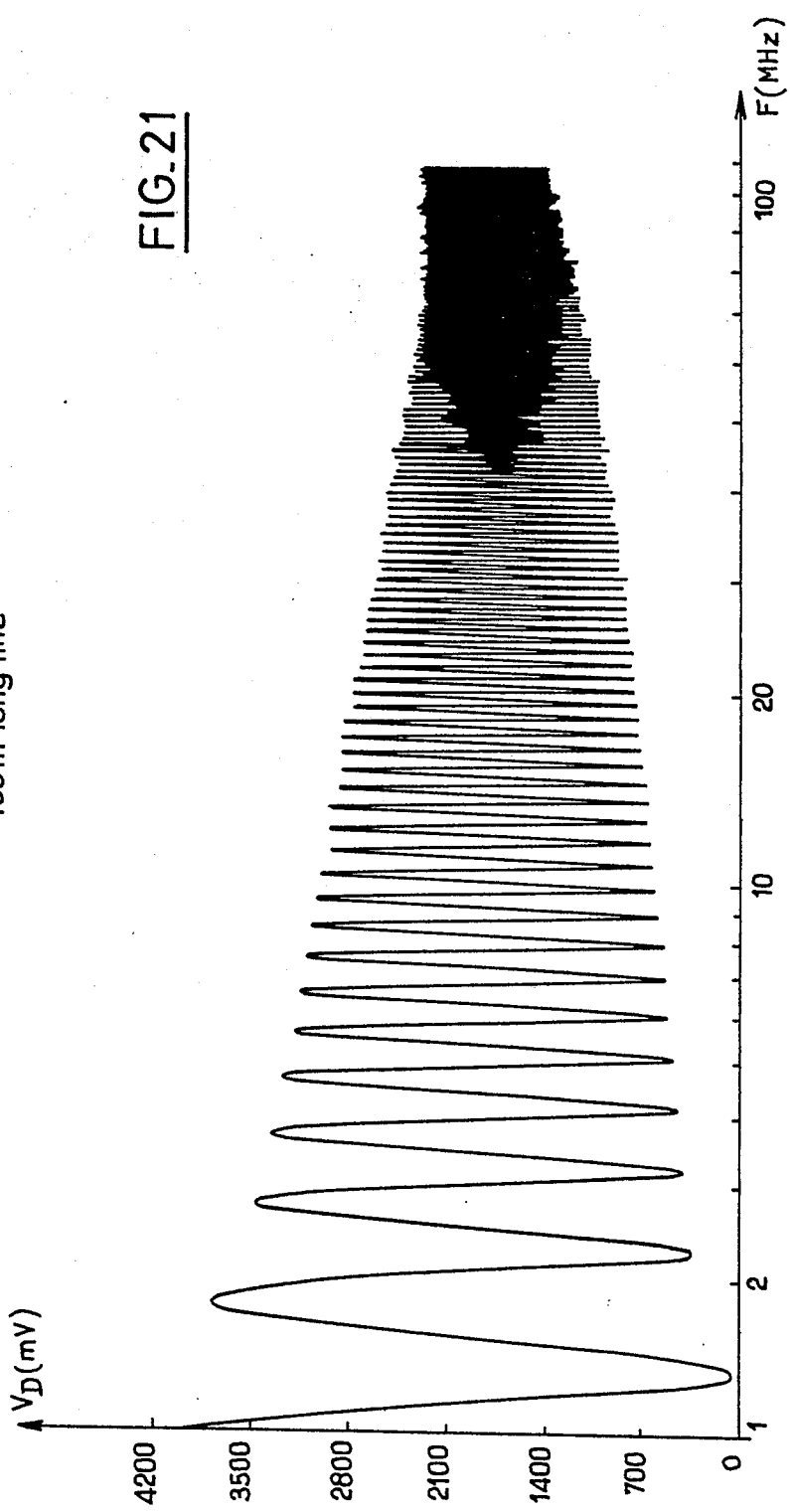

FIG. 21 shows the response of a capacitor equivalent to a single branch $R_2C_2$ where $R_2=180$ ohms, and $C_2=1$ nF (measured on a 100 m line).

FIG. 18 shows the voltage $V_D$ which is proportional to $|v_i(l)|$, i.e. they show a voltage which is proportional to the modulus of the incident voltage at the output from the line when the incident voltage $|v_i(0)|$ is kept constant at the input to the line. FIG. 18 thus shows the attenuation coefficient for a short line and for a long line.

DETECTOR CIRCUIT 700 SHOWN IN FIG. 22

Figure 22:
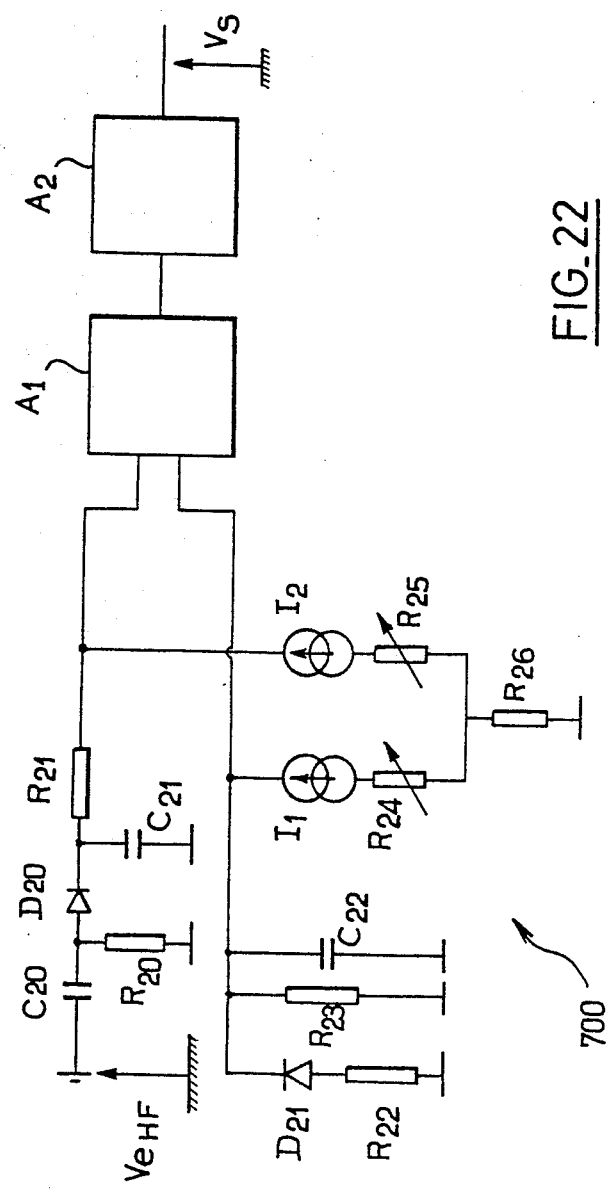
FIG 22 is a circuit diagram of a detector circuit for performing the test method on a long line.

The detector circuit 700 shown in FIG. 22 is for use in detecting the total wave, using a quadratic law, and in conjunction with a long transmission line.

The detector circuit comprises two schottky diodes D20 and D21. The diode D20 is used for quadratic detection of very high frequency voltages, while the diode D21 is used as a reference element.

The output from the VHF generator is connected via a capacitor C20 to the anode of the diode D20. The common point between the capacitor C20 and the diode D20 is connected to ground via a resistor R20. The cathode of the diode D20 is connected to ground via a capacitor C21 and it is connected to a first input of a differential amplifier A1 via a resistor R21. The resistor R20 is used to match the input impedance to 50 ohms. The capacitor C21 and the resistor R21 constitute a lowpass filter.

The anode of the diode D21 is connected to ground via a resistor R22. The cathode of the diode D21 is connected to the second input of the differential amplifier A1. The cathode is also connected to ground via a cell comprising a resistor R23 and a capacitor C22 connected in parallel.

The diodes D20 and D21 are biased by respective constant current generators I1 and I2 which are associated with respective variable resistors R24 and R25 which are connected in common to ground via a resistor R26, thereby increasing detector sensitivity.

The differential amplifier A1 is used not only to amplify the signal, but also to eliminate the effect of the constant current biasing the two diodes.

The output from the differential amplifier A1 is connected to a second amplifier stage A2.

Since the input voltage $V_{eHF}$ applied to the capacitor C20 is sinusoidal:

$$V_{eHF} = V_m \sin(wt + \phi) \quad (67)$$

so that the output signal $V_s$ available at the output from the second amplifier stage A2 is a DC signal of the following form:

$$V_s = K.G1.G2.R_{ch}.I_s.V_m^2 \quad (68)$$

where:

K is a constant,

G1 and G2 are the gains of the differential amplifier stage A1 and the second amplifier stage A2 respectively, $R_{ch}$ is the load resistance, $I_s$ is the saturation current of the detector diode D20, and $V_m$ is the peak voltage of the VHF wave.

CORRECTOR CIRCUIT SHOWN IN FIG. 23

As specified above, the total voltage at the input to the line is given by the equation:

$$v_t = v_i + v_r = v_i[1 + |\Gamma|e^{-2\alpha(w)l}e^{j(\psi - 2(l/v)w)}] \quad (27)$$

Because of the great length of the line, the phase of the reflected wave $v_r$ varies very rapidly with changing frequency. It may be assumed that the functions $|\Gamma(w)|e^{-2\alpha(w)l}$ and $\psi(w)$ vary much more slowly. $|\Gamma(w)|$ can be determined by conidering only the top envelope of the $v_t$ curve, giving:

$$v_t = v_i(1 + |\Gamma|e^{-2\alpha(w)l}) \text{ and} \quad (69)$$

$$\frac{|v_t| - |v_i|}{|v_i|} = |\Gamma|e^{-2\alpha(w)l} \text{ with} \quad (70)$$

$$\alpha = \frac{66\, \eta 0 \sqrt{\epsilon_r}\,(1/a + 1/b)}{4\, R_c\, C_0} f^{\frac{1}{2}} \text{ where} \quad (71)$$

2a and 2b are respectively the inside and the outside diameter of the coaxial transmission line used;

$R_c$ is the characteristic resistance of the line;

$C_0$ is the speed of propagation in vacuo; and f is the frequency of the wave transmitted by the line.

The term $e^{-2\alpha(w)l}$ which comes into equation (70) for determining $|\Gamma|$ using the moduluses $|v_t|$ and $|v_i|$ is a disturbing term. It may be calculated if $\alpha(w)$ is known. Nevertheless, the circuit shown in FIG. 23 is capable of eliminating the above term in $e^{-2\alpha(w)l}$.

The block diagram of FIG. 23 begins with the detector circuit 700 shown in FIG. 22, and its output signal $v_s$ is proportional to $|v_t|^2$.

The output from the detector circuit 700 is applied to a square root extractor circuit 710 which serves to provide an output signal proportional to $|v_t|$.

The output from the square root extractor 710 is applied firstly to a first input of a subtractor circuit 720 and secondly to an integrator circuit 722 which provides an output signal proportional to $|v_i|$. The output from the integrator 722 is connected to the second input of the subtractor 720. The output signal from the subtractor is proportional to the difference $|v_t| - |v_i|$ and it is applied to a numerator input of a divider circuit 730. The denominator input of the divider 730 is connected to the output from the integrator 722 in order to receive the signal proportional to $|v_i|$.

The output signal from the divider 730 is thus proportional $(|v_t| - |v_i|)/|v_i|$. This signal is applied to the input of a logarithm circuit 735.

The output signal from the logarithm circuit 735 is proportional to $-kf^{\frac{1}{2}} + \log|\Gamma|$ (see equations 70 and 71). This signal is applied to a first input of an adder circuit 750.

The corrector circuit shown in FIG. 23 also makes use of the sawtooth signal generator 200 described above for controlling wobbulation of the VHF generator. The sawtooth generator 200 delivers a voltage proportional to the frequency f.

This signal is applied to a second square root extractor circuit 742 which in turn provides an output signal proportional to $f^{\frac{1}{2}}$.

This signal is applied to an amplifier stage 744 whose gain is set to deliver an output signal proportional to $kf^{\frac{1}{2}}$.

This signal is applied to the second input of the adder 750, thus causing the adder to provide an output signal proportional to $\log |\Gamma|$, and this signal is applied in turn to an antilogarithm circuit 760 whose output provides a signal directly proportional to $|\Gamma|$, i.e. which is directly proportional to the coefficient of reflection.

THE CIRCUIT SHOWN IN FIG. 24

The circuit shown in FIG. 24 serves to determine the phase of the element connected to the end of the line.

This circuit makes use of a reference transmission line $l_r$ which is terminated by an impedance $I_R$ which is a real resistance and which gives a reference phase. The reference line $l_r$ has the same length as the line 1 connecting the VHF generator G to the impedance Y being tested.

The incident wave from the VHF generator is applied via the main port of a directional coupler 800 to the measurement line 1, and via the coupling port thereof to the reference line $l_r$.

More precisely, the directional coupler 800 is connected to the measurement line 1 via an impedance matching and separator stage 820, and it is connected to the reference line $l_r$ via a second impedance matching and separator stage 810.

The total wave is detected at the input to each of the lines by respective detector circuits 900 and 900'.

The outputs from the detectors are applied to respective comparators 910 and 910' which are connected to compare the signals from the detectors with respective threshold values and to provide a binary or on/off signals depending on the results of the comparisons. These binary comparison signals are applied to respective inputs of an exclusive-OR gate 920 whose output is applied to a lowpass filter 930.

The detected total waves or the moduluses of the detected total waves on both lines will vary as a low frequency sinusoids as the excitation frequency applied to both lines is varied. If the impedance under test Y is different in kind from the reference impedance $I_R$, then there will be a phase shift between said sinusoids.

The detectors 900 and 900', the comparators 910 and 910', the exclusive-OR gate 920, and the lowpass filter 930, thus constitute a low frequency phase meter which generates a signal proportional to the phase of the element Y connected to the output from the measurement line 1.

We claim:

1. A method of rapidly testing passive two terminal devices in the VHF range, said method comprising the steps of:
   (i) providing a distributed constant transmission line comprising a first end and a second end, and having a characteristic impedance $R_c$;
   (ii) providing a resistive $\pi$ network having an input and an output, said resistive $\pi$ network comprising:
   a first leg including two resistances connected in series between said input and the ground, and an intermediate tab between said two resistances wherein a first resistance of said first leg, which is connected between the ground and the intermediate tab of the first leg has a value equal to $\frac{2}{3}$ of the characteristic impedance $R_c$ of said line, while a second resistance of said first leg, which is connected between the input and the intermediate tab of said first leg has a value equal to 4/3 of the characteristic impedance $R_c$ of said line,
   a second leg including two resistances connected in series between said output and the ground, and an intermediate tab between said two resistances,
   wherein a first resistance of said second leg, which is connected between the ground and the intermediate tab of the second leg has a value equal to $\frac{2}{3}$ of the characteristic impedance $R_c$ of said line, while a second resistance of said second leg, which is connected between the output and the intermediate tab of said second leg has a value equal to 4/3 of the characteristic impedance $R_c$ of said line, and
   a third leg including a resistance connected between said input and said output, and having a value equal to 4/3 of the characteristic impedance $R_c$ of said line,
   (iii) connecting the output of said resistive $\pi$ network to the first end of said line,
   (iv) connecting an elecric signal generator capable of generating frequencies in the VHF range and having an internal impedance equal to the characteristic impedance of the line to the input of said resistive $\pi$ network,
   (v) connecting a two terminal device to be tested to the second end of said line,
   (vi) detecting a first signal related to the wave $V_r$ reflected by the device under test, between the output of said resistive $\pi$ network and the intermediate tab of said first leg,
   (vii) detecting a second signal related to the incident wave $V_i$, between the input of said resistive $\pi$ network and the intermediate tab of said second leg,
   (viii) determining the behavior of a reflection coefficient $\Gamma$ in the VHF range on the basis of the ratio of the modulus of the first signal and the modulus of the second signal $|V_r|/|V_i|$ to deduce the impedance of the two terminal device.

2. A method according to claim 1, wherein the generator feeds the line with a periodic incident wave $V_i$ whose frequency is modulated in the VHF range while the test is being performed.

3. A method according to claim 2, wherein the line is fed with a periodic incident wave $v_i$ whose period varies over a range from about 1 μs to about 5 ns over a test duration of about 1 s.

4. A method according to claim 3, wherein the line is fed with a periodic incident wave $v_i$ whose period is modulated by wobbulation over the VHF range using a linear or a logarithmic function of time.

5. A method according to claim 1, further comprising the steps of:
   detecting the total voltage $V_t$ at the output of the resistive $\pi$ network, and
   determining an argument of said reflection coefficient arg $\Gamma$ on basis of the following equation:

$$\arg \Gamma = 2\beta 1 + \arccos \frac{v_t^2 - v_i^2 - v_r^2}{2|v_r||v_i|}$$

wherein $\beta$ is the phase constant of the line and 1 is the length of the line.

6. A method according to claim 1, wherein the two-terminal device is constituted by a capacitor having a modulus of admittance which varies as a series of levels of value $G_j$, which levels are determined during step (viii) on the basis of the following equation:

$$G_j = \frac{1}{R_c} \frac{1 - |\Gamma_j|}{1 + |\Gamma_j|} \text{ where}$$

$R_c$ is the characteristic impedance of the line, and $|\Gamma_j|$ is the modulus of reflection coefficient.

7. A method according to claim 6, for analyzing capacitors in the form of a ladder network comprising n parallel branches each of which is constituted by a resistance $R_j$ and a capacitance $C_j$ connected in series, wherein the resistance $R_j$ and the capacitance $C_j$ are determined during step (viii) on the basis of the equation:

$$1/R_j = G_j - G_{j-1}$$

where $G_j$ and $G_{j-1}$ are two successive levels in the modulus of the admittance $|Y|$, and the equation $$C_j = (G_j - G_{j-1})/w_j$$

where $w_j$ is the resonant angular frequency of the j-th branch.

8. A method according to claim 1 wherein said electric signal generator comprises a variable frequency oscillator with automatic frequency band switching.

9. A method according to claim 8, wherein the oscillator comprises a wavetrap associated with a varicap diode which is biased by a sawtooth signal for providing wobbulation within each frequency band, the wavetrap of the oscillator including a plurality of inductors which are successively switched into or out of circuit in order to provide said frequency band switching.

10. A method according to claim 9, wherein frequency band switching signals for successively switching the inductors of the wavetrap into or out of circuit are generated from the sawtooth signal which biases the varicap diode.

11. A method according to claim 10, wherein the frequency band switching signals are generated at the outputs from a serial-in, parallel-out shift register controlled by the signal from the sawtooth generator.

12. A method of rapidly testing passive two terminal devices in the VHF range, said method comprising the steps of:
(i) providing a long distributed constant transmission line comprising a first end and a second end and having a characteristic impedance $R_c$,
(ii) connecting an electric signal generator capable of generating frequencies in the VHF range and having an internal impedance equal to the characteristic impedance of the line to the first end of said line,
(iii) connecting a two terminal device to be tested to the second end of said line,
(iv) detecting the total voltage $v_t$ at the first end of the line,
(v) detecting the maxima $v_{tM}$ and the minima $v_{tm}$ in the total voltage $v_t$ and
(vi) determining a modulus of the reflection coefficient $|\Gamma|$ on the basis of the following equation:

$$|\Gamma| = (|v_{tM}| - |v_{tm}|)e^{2\alpha l}/(|v_{tM}| + |v_{tm}|)$$

wherein
$\alpha$ represents the attenuation of the line and
$l$ represents the length of the line.

13. A method according to claim 12, wherein the generator feeds the line with a periodic incident wave $v_i$ whose frequency is modulated in the VHF range while the test is being performed.

14. A method according to claim 12, wherein the long line is about 100 m long.

15. A method according to claim 12, wherein the line is fed with a periodic incident wave $v_i$ whose period varies over a range from about 1 $\mu$s to about 5 ns over a test duration of about 1 s.

16. A method according to claim 15, wherein the line is fed with a periodic incident wave $v_i$ whose period is modulated by wobbulation over the VHF range using a linear or a logarithmic function of time.

17. A method according to claim 12, wherein the two-terminal device is constituted by a capacitor having a modulus of admittance which varies as a series of levels of value $G_j$, which levels are determined on the basis of the following equation:

$$G_j = \frac{1}{R_c} \frac{1 - |\Gamma_j|}{1 + |\Gamma_j|}$$

$R_c$ is a characteristic impedance of the line, and $|\Gamma_j|$ is the modulus of reflection coefficient.

18. A method according to claim 17, for analyzing capacitors in the form of a ladder network comprising n parallel branches each of which is constituted by a resistance $R_j$ and a capacitance $C_j$ connected in series, wherein the resistance $R_j$ and the capacitance $C_j$ are determined on the basis of the equation:

$$1/R_j = G_j - G_{j-1}$$

where $G_j$ and $G_{j-1}$ are two successive levels in the modulus of the admittance $|Y|$, and the equation $$C_j = (G_j - G_{j-1})/w_j$$

where $w_j$ is the resonant angular frequency of the j-th branch.

19. A method according to claim 12 wherein said electric signal generator comprises a variable frequency oscillator with automatic frequency band switching.

20. A method according to claim 19, wherein the oscillator comprises a wavetrap associated with a varicap diode which is biased by a sawtooth signal for providing wobbulation within each frequency band, the wave trap of the oscillator including a plurality of inductors which are successively switched into or out of circuit in order to provide said frequency band switching.

21. A method according to claim 20, wherein frequency band switching signals for successively switching the inductors of the wavetrap into or out of circuit are generated from the sawtooth signal which biases the varicap diode.

22. A method according to claim 21, wherein the frequency band switching signals are generated at outputs from a serial-in, parallel-out shift register controlled by the signal from the sawtooth generator.

23. A method of rapidly testing passive two terminal devices in the VHF range according to claim 12, said method comprising the steps of:
(i) providing a long distributed constant transmission first line comprising a first end and a second end and having a characteristic impedance $R_c$,
(ii) connecting an electric signal generator to a first end of said line, said generator being capable of generating an electric signal whose frequency is linearly modulated in the VHF range, and said generator having an internal impedance equal to the characteristic impedance of the line, (iii) connecting a two terminal device to be tested to the second end of said line, (iv) providing a reference second line comprising a first end and a second end and having the same length and the same characteristic impedance than said first line, (v) connecting the first end of said reference second line to said generator by way of a directional coupler, (vi) connecting a pure resistance to the second end of said reference second line, (vii) detecting the total voltage $v_t$ at the first end of the first line, (viii) detecting the maxima $v_{tM}$ and the minima $v_{tm}$ in the total voltage $v_t$, (ix) determining a modulus of the reflection coefficient $|\Gamma|$ on the basis of the following equation:

$$|\Gamma| = (|v_{tM}| - |v_{tm}|)e^{2\alpha l}/(|v_{tM}| + |v_{tm}|)$$

wherein
$\alpha$ represents the attenuation of the line and
$l$ represents the length of the line, and (x) connecting a low frequency phase meter between said first end of said first line and said reference second line to detect the argument of the reflection coefficient.

24. An apparatus for rapidly testing passive two terminal devices in the VHF range, said apparatus comprising:
a distributed constant transmission line comprising a first end and a second end, and having a characteristic impedance $R_c$,
a resistive network having an input and an output, said resistive network comprising:
a first leg including two resistances connected in series between said input and the ground, and an intermediate tab between said two resistances wherein a first resistance of said first leg, which is connected between the ground and the intermediate tab of the first leg has a value equal to ⅔ of the characteristic impedance $R_c$ of said line, while a second resistance of said first leg, which is connected between the input and the intermediate tab of said first leg has a value equal to 4/3 of the characteristic impedance $R_c$ of said line,
a second leg including two resistances connected in series between said output and the ground, and an intermediate tab between said two resistances,
wherein a first resistance of said second leg, which is connected between the ground and the intermediate tab of the second leg has a value equal to ⅔ of the characteristic impedance $R_c$ of said line while a second resistance of said second leg, which is connected between the output and the intermediate tab of said second leg has a value equal to 4/3 of the characteristic impedance $R_c$ of said line and
a third leg including a resistance connected between said input and said output, and having a value equal to 4/3 of the characteristic impedance $R_c$ of said line,
the output of said resistive $\pi$ network being connected to the first end of said line
an electric signal generator capable of generating frequencies in the VHF range and having an internal impedance equal to the characteristic impedance of the line connected to the input of said resistive $\pi$ network,
a two terminal device to be tested connected to the second end of said line,
means for detecting a first signal related to the wave $V_r$ reflected by the device under test, between the output of said resistive $\pi$ network and the intermediate tab of said first leg
means for detecting a second signal related to the incident wave $V_i$, between the input of said resistive $\pi$ network and the intermediate tab of said second leg, and
means for determining the behavior of a reflection coefficient $\Gamma$ in the VHF range on the basis of the ratio of the modulus of the first signal and the modulus of the second signal $|V_r|/|V_i|$ to deduce the impedance of the two terminal device.

25. Apparatus according to claim 24, wherein the generator is adapted to feed the line with a periodic incident wave $v_i$ whose period varies over a range from about 1 µs to about 5 ns with a test duration of about 1 s.

26. Apparatus according to claim 24, wherein the two terminal device is a capacitor, said apparatus comprising means suitable for determining levels $G_j$ in a modulus of admittance $|Y|$ of said capacitor using the equation:

$$G_j = \frac{1}{R_c} \frac{1 - |\Gamma_j|}{1 + |\Gamma_j|} \text{ where}$$

$R_c$ is a characteristic impedance of the line, and $|\Gamma_j|$ is the modulus of reflection coefficient.

27. Apparatus according to claim 26, for analyzing capacitors in the form of a ladder network comprising n parallel branches each of which is constituted by a resistance $R_j$ and a capacitance $C_j$ connected in series, wherein the apparatus comprises:
means suitable for determining the resistance $R_j$ the basis of the equation:

$$1/R_j = G_j - G_{j-1}$$

where $G_j$ and $G_{j-1}$ are two successive levels in the modulus of the admittance $|Y|$; and
means suitable for determining the capacitance $C_j$ on the basis of the equation $$C_j = (G_j - G_{j-1})/w_j$$

where $w_j$ is the resonant angular frequency of the j-th branch.

28. Apparatus according to claim 24, wherein the generator includes a variable frequency oscillator with automatic frequency band switching.

29. Apparatus according to claim 28, including a sawtooth signal generator, and wherein the oscillator comprises a wavetrap associated with a varicap diode which is biased by the sawtooth signal from said generator for providing wobbulation within each frequency band, the wavetrap of the oscillator including a plurality of inductors which are successively switched into or out of circuit in order to provide said frequency band switching.

30. Apparatus according to claim 29, wherein the sawtooth signal generator also generates frequency band switching signals for progressively switching the inductors of the oscillator wavetrap into or out of service.

31. Apparatus according to claim 30, including a serial-in, parallel-out shift register controlled by the sawtooth signal generator, with the signals present on the outputs of the shift register constituting the frequency band switching signals.

32. An apparatus for rapidly testing passive two terminal devices in the VHF range, said apparatus comprising:
  a long distributed constant transmission line comprising a first end and a second end and having a characteristic impedance $R_c$,
  an electric signal generator capable of generating frequencies in the VHF range and having an internal impedance equal to the characteristic impedance of the line connected to the first end of said line,
  a two terminal device be tested connected to the second end of said line,
  means for detecting the total voltage $v_t$ at the first end of the line,
  means for detecting the maxima $v_{tM}$ and the minima $v_{tm}$ in the total voltage $v_t$ and
  means for determining a modulus of the reflection coefficient $|\Gamma|$ on the basis of the following equation:

$$|\Gamma|=(|v_{tM}|-|v_{tm}|)e^{2\alpha l}/(v_{tM}|+|v_{tm}|)$$

wherein
$\alpha$ represents the attenuation of the line and
l represents the length of the line.

33. An apparatus for rapidly testing passive two terminal devices in the VHF range according to claim 32, said apparatus comprising:
  a long distributed constant transmission first line comprising a first end and a second end and having a characteristic impedance $R_c$,
  an electric signal generator connected to a first end of said line, said generator being capable of generating an electric signal whose frequency is linearly modulated in the VHF range, and said generator having an internal impedance equal to the characteristic impedance of the line,
  a two terminal device to be tested connected to the second end of said line,
  a reference second line comprising a first end and a second end and having the same length and the same characteristic impedance than said first line, the first end of said reference second line being connected to said generator by way of a directional coupler,
  a pure resistance connected to the second end of said reference second line,
  means for detecting the total voltage $v_t$ at the first end of the first line,
  means for detecting the maxima $v_{tM}$ and the minima $v_{tm}$ in the total voltage $v_t$,
  means for determining a modulus of the reflection coefficient $|\Gamma|$ on the basis of the following equation:

$$|\Gamma|=(|v_{tM}|-|v_{tm}|)e^{2\alpha l}/(|v_{tM}|+|v_{tm}|)$$

wherein
$\alpha$ represents the attenuation of the line and
l represents the length of the line, and
a low frequency phase meter between said first end of said first line and said reference second line to detect the argument of the reflection coefficient.

34. A according to claim 33, wherein the low frequency meter comprises:
  first and second detectors respectively connected to said first ends of the first and second lines to detect the total wave at the input to each of said lines;
  first and second threshold comparators connected to compare the output levels from respective ones of said detectors with a threshold value;
  an exclusive-OR gate having its inputs connected to respective outputs from said comparators; and
  a lowpass filter connected to the output from said exclusive-OR gate and delivering a signal proportional to a phase of the impedance to be analyzed.

35. Apparatus according to claim 32, wherein the generator is adapted to feed the line with a periodic incident wave $v_i$ whose period varies over a range from about 1 $\mu$s to about 5 ns with a test duration of about 1 s.

36. Apparatus according to claim 32, whereiln the two terminal device is a capacitor, said apparatus comprising means suitable for determining levels $G_j$ in modulus of admittance $|Y|$ of said capacitor using the equation:

$$G_j = \frac{1}{R_c} \frac{1-|\Gamma_j|}{1+|\Gamma_j|} \text{ where}$$

$R_c$ is a characteristic impedance of the line, and $|\Gamma_j|$ is the modulus of reflection coefficient.

37. Apparatus according to claim 36, for analyzing capacitors in the form of a ladder network comprising n parallel branches each of which is constituted by a resistance $R_j$ and a capacitance $C_j$ connected in series, wherein it comprises:
  means suitable for determining the resistance $R_j$ the basis of the equation:

$$1/R_j = G_j - G_{j-1}$$

where $G_j$ and $G_{j-1}$ are two successive levels in the modulus of the admittance $|Y|$; and
  means suitable for determining the capacitance $C_j$ on the basis of the equation $$C_j = (G_j - G_{j-1})/w_j$$

where $w_j$ is the resonant angular frequency of the j-th branch.

38. Apparatus according to claim 32, wherein the line is about 100 m long.

39. Apparatus according to claim 32, wherein the generator includes a variable frequency oscillator with automatic frequency band switching.

40. Apparatus according to claim 39, including a sawtooth signal generator, and wherein the oscillator comprises a wavetrap which is associated with a varicap diode which is biased by the sawtooth signal from said generator for providing wobbulation within each frequency band, the wavetrap of the oscillator including a plurality of inductors which are successively switched into or out of circuit in order to provide said frequency band switching.

41. Apparatus according to claim 40, wherein the sawtooth signal generator also generates frequency band switching signals for progressively switching the inductors of the oscillator wavetrap into or out of service.

42. Apparatus according to claim 41, including a serial-in, parallel-out shift register controlled by the sawtooth signal generator, with signals present on the outputs of the shift register constituting the frequency band switching signals.

43. Apparatus according to claim 32, comprising:
a detector connected to the first end of the line and suitable for detecting the total wave using a quadratic law;
a first square root extractor circuit connected to the output from said detector;
an integrator connected to the output from the first square root extractor circuit;
a subtractor having a first input connected to the output from the first square root extractor circuit and having its second input connected to the output from the integrator;
a divider having a first input connected to the output from the subtractor and its second input connected to the output from the integrator;
a logarithm extractor circuit connected to the output from the divider;
a frequency signal generator for delivering a voltage proportional to the frequency applied to the line;
a second square root extractor circuit connected to the output from said frequency signal generator;
an amplifier stage connected to the output from said second square root extractor circuit;
an adder having a first input connected to the output from the logarithm extractor circuit and having its second input connected top the output from the amplifier stage; and
an antilogarithm circuit connected to the output from the adder and delivering a signal at its output which is directly proportional to the modulus of the reflection coefficient.

* * * * *